US012812933B2

(12) United States Patent
Lin et al.

(10) Patent No.: US 12,812,933 B2
(45) Date of Patent: Nov. 24, 2026

(54) SEMICONDUCTOR DEVICE STRUCTURE WITH STACKED NANOSTRUCTURES AND VARYING INNER SPACERS AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 357 days.

(21) Appl. No.: 18/410,377

(22) Filed: Jan. 11, 2024

(65) Prior Publication Data

US 2025/0234604 A1 Jul. 17, 2025

(51) Int. Cl.

*H10D 62/10* (2025.01)
*H10D 30/67* (2025.01)
*H10D 64/01* (2025.01)

(52) U.S. Cl.

CPC ....... *H10D 62/121* (2025.01); *H10D 30/6735* (2025.01); *H10D 30/6757* (2025.01); *H10D 64/017* (2025.01); *H10D 64/018* (2025.01); *H10D 64/021* (2025.01)

(58) Field of Classification Search

CPC ............. H10D 62/121; H10D 30/6735; H10D 30/6757; H10D 64/021; H10D 64/017; H10D 64/018

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Changhyun Yi

(74) *Attorney, Agent, or Firm* — Birch, Stewart, Kolasch & Birch, LLP

(57) ABSTRACT

A semiconductor device structure includes first nanostructures formed over a substrate. The structure also includes a first gate structure wrapped around the first nanostructures. The structure also includes first source/drain epitaxial structures formed over opposite sides of the first nanostructures. The structure also includes first inner spacers formed between the first gate structure and the first source/drain epitaxial structures. The structure also includes second nanostructures formed over the first nanostructures. The structure also includes a second gate structure wrapped around the second nanostructures. The structure also includes second source/drain epitaxial structures formed over opposite sides of the second nanostructures. The structure also includes second inner spacers formed between the second gate structure and the second source/drain epitaxial structures. The first inner spacers and the second inner spacers have different widths.

20 Claims, 38 Drawing Sheets

(56) References Cited

U.S. PATENT DOCUMENTS

| | | | | |
|---|---|---|---|---|
| 9,608,116 | B2 | 3/2017 | Ching et al. | |
| 2019/0221638 | A1* | 7/2019 | Reznicek | H10D 62/114 |
| 2024/0030284 | A1* | 1/2024 | Kang | H10D 64/021 |
| 2025/0040206 | A1* | 1/2025 | Kim | H10D 84/0186 |
| 2025/0040242 | A1* | 1/2025 | Park | H10D 30/6735 |

* cited by examiner

SEMICONDUCTOR DEVICE STRUCTURE WITH STACKED NANOSTRUCTURES AND VARYING INNER SPACERS AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, complementary FET (CFET) have been introduced. In a CFET structure, an NMOS device may be stacked on top of a PMOS device, so that the effective channel width of the resulting device may be further maximized.

However, integration of fabrication of the CFET devices can be challenging. While the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A, 3A-1, 3B, 3B-1, 3C, 3C-1, 3D, 3D-1, 3D-2 are cross-sectional representations of various stages of forming a semiconductor device structure, in accordance with some embodiments of the disclosure.

FIGS. 4A, 4A-1, 4B, 4B-1, 4B-2, 4C, 4C-1, 4D, 4D-1, 4E, 4E-1, 4F, 4F-1, 4F-2, 4G, 4G-1, 4G-2 are cross-sectional representations of various stages of forming a semiconductor device structure, in accordance with some embodiments of the disclosure.

FIGS. 5A, 5B, 5B-1, 5C, 5D, 5D-1, 5D-2 are cross-sectional representations of various stages of forming a semiconductor device structure, in accordance with some embodiments of the disclosure.

DETAILED DESCRIPTION

Figure 1B:
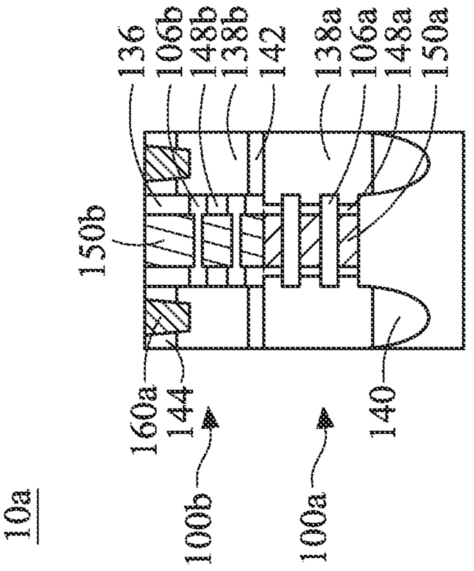
FIG. 1B is a cross-sectional representation of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, forksheet structures, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Complementary metal-oxide-semiconductor field effect transistors (CMOSFET or CFET) are used in the semiconductor industry due to their high noise immunity and low static power consumption. A CFET may include an n-type transistor and a p-type transistor. In some embodiments, the n-type transistor and the p-type transistor are vertically oriented to form a CFET structure with a top transistor stacked over a bottom transistor.

Embodiments for forming a semiconductor device structure are provided. The method for forming the semiconductor device structure may include forming inner spacers with different widths for the p-type transistor and the n-type transistor in the CFET structure. With thicker inner spacers, the capacitance may be reduced. With thinner inner spacers, the on-current may be enhanced. Therefore, device performance may be improved.

Figure 1A:
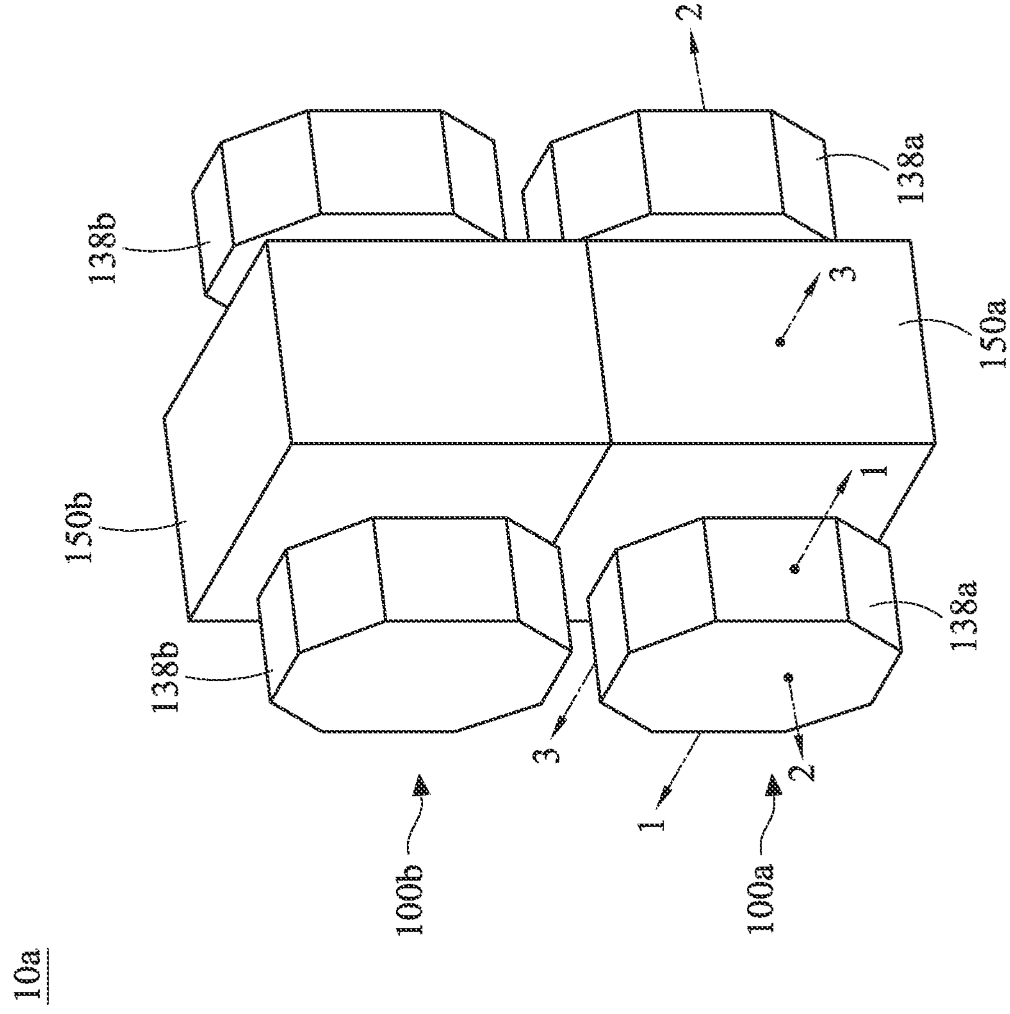
FIG. 1A is a perspective representation of a semiconductor device structure, in accordance with some embodiments of the disclosure.

The semiconductor device structure 10*a* may be a CFET structure. FIG. 1A is a perspective representation of a semiconductor device structure 10*a*, in accordance with some embodiments of the disclosure. FIG. 1B is a cross-sectional representation of a semiconductor device structure 10*a*, in accordance with some embodiments of the disclosure. FIG. 1B shows a cross-sectional representation taken along line 2-2 in FIG. 1A.

The semiconductor device structure 10*a* may include a first transistor 100*a* and a second transistor 100*b* with different conductivity types stacked with each other. An isolation layer 142 may be formed between the first source/drain epitaxial structures 138*a* of the first transistor 100*a* and the second source/drain epitaxial structures 138*b* of the second transistor 100*b*.

The first transistor 100*a* may be a nanostructure transistor (e.g. a nanosheet transistor, a nanowire transistor, a multi-bridge channel transistor, a nano-ribbon FET, or a gate all around (GAA) transistor). The first transistor 100*a* may be an n-type transistor or a p-type transistor. In some embodiments, the first transistor 100*a* includes a first channel layer 106*a*, a first gate structure 150*a* wrapped around the first channel layer 106*a*, and first source/drain epitaxial structures 138*a* attached to the first channel layer 106*a*. In some embodiments, first inner spacers 148*a* are formed between the first gate structure 150*a* and the first source/drain epitaxial structures 138*a*.

The first channel layer 106*a* may be used as the active region of the first transistor 100*a* and extends between the first source/drain epitaxial structures 138*a*. It is noted that although two first channel layer 106*a* are shown in FIG. 1B, the first transistor 100*a* may include a number of first channel layers 106*a* (e.g. one to four, or more than four) vertically stacked. The first channel layer 106*a* may include nanostructures, nanosheet structures, or nanowires.

The first source/drain epitaxial structures 138*a* are formed at opposite sides of the first channel layer 106*a*, as shown in FIG. 1B in accordance with some embodiments. The first gate structure 150*a* is formed around the first channel layer 106*a* and between the first source/drain epitaxial structures 138*a* in accordance with some embodiments. A dielectric structure 140 may be formed between the substrate 102 and the first source/drain epitaxial structures 138*a*.

The second transistor 100*b* may be a nanostructure transistor (e.g. a nanosheet transistor, a nanowire transistor, a multi-bridge channel transistor, a nano-ribbon FET, or a gate all around (GAA) transistor). The second transistor 100*b* may be an n-type transistor or a p-type transistor. In some embodiments, the second transistor 100*b* includes a second channel layer 106*b*, a second gate structure 150*b* wrapped around the second channel layer 106*b*, and source/drain epitaxial structures 138*b* attached to the second channel layer 106*b*. In some embodiments, second inner spacers 148*b* are formed between the second gate structure 150*b* and the second source/drain epitaxial structures 138*b*.

The second channel layer 106*b* may be used as the active region of the second transistor 100*b* and extends between the second source/drain epitaxial structures 138*b*. It is noted that although two second channel layer 106*b* is shown in FIG. 1B, the second transistor 100*b* may include a number of second channel layers 106*b* (e.g. one to four, or more than four) vertically stacked. The second channel layer 106*b* may include nanostructures, nanosheet structures, or nanowires. The number of the first channel layers 106*a* and the second channel layers 106*b* may be different.

The second source/drain epitaxial structures 138*b* are formed at opposite sides of the second channel layer 106*b*, as shown in FIG. 1B in accordance with some embodiments. The second gate structure 150*b* is formed around the second channel layer 106*b* and between the second source/drain epitaxial structures 138*b* in accordance with some embodiments. In some embodiments, gate spacers 136 are formed on the sidewalls of the second gate structure 150*b*. In some embodiments, an etch stop layer 144 and an interlayer dielectric layer (not shown in FIG. 1B) is formed over the second source/drain epitaxial structures 138*b*.

In some embodiments, the first inner spacers 148*a* of the first transistor 100*a* and the second inner spacers 148*b* of the second transistor 100*b* have different widths. For example, the second inner spacers 148*b* are wider than the first inner spacers 148*a* as shown in FIG. 1B in accordance with some embodiments. With thicker inner spacer, the capacitance may be reduced. With thinner inner spacer, the on-current may be enhanced. First inner spacers 148*a* and second inner spacers 148*b* with different widths may provide more flexibility to boost device speed.

FIGS. 2A, 2B, 2C, 2D, 2D-1, 2E, 2E-1, 2F, 2F-1, 2G, 2G-1, 2H, 2H-1, 2I, 2I-1, 2J, 2J-1, 2K, 2K-1, 2L, 2L-1, 2M, 2M-1, 2N, 2N-1, 2N-2, 2O, 2O-1, 2P, 2P-1, 2Q, 2Q-1, 2Q-2, 2R, 2R-1, 2R-2 are cross-sectional representations of various stages of forming a semiconductor device structure 10*a*, in accordance with some embodiments of the disclosure. FIGS. 2A, 2B, 2C, 2D, 2E, 2F, 2G, 2H, 2I, 2J, 2K, 2L, 2M, 2N, 2Q, 2R show cross-sectional representations taken along line 1-1 in FIG. 1A. FIGS. 2E-1, 2F-1, 2G-1, 2H-1, 2I-1, 2J-1, 2K-1, 2L-1, 2M-1, 2N-1, 2O, 2P, 2Q-1, 2R-1 show cross-sectional representations taken along line 2-2 in FIG. 1A. FIGS. 2D-1, 2N-2, 2O-1, 2P-1, 2Q-2, 2R-2 shows cross-sectional representations taken along line 3-3 in FIG. 1A.

Figure 2B:
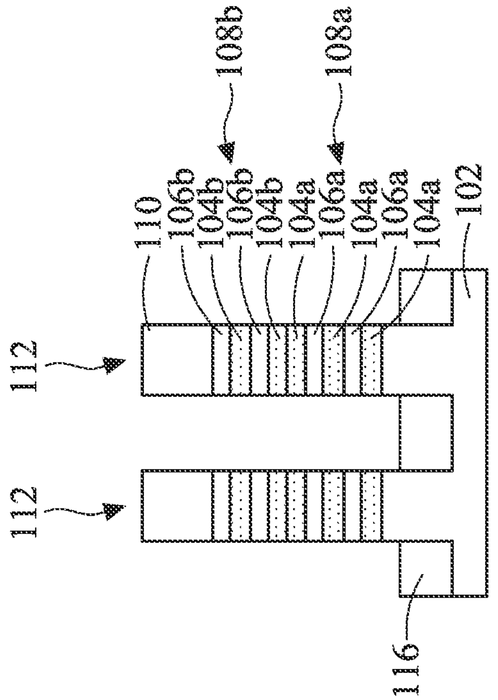
FIGS. 2A, 2B, 2C, 2D, 2D-1, 2E, 2E-1, 2F, 2F-1, 2G, 2G-1, 2H, 2H-1, 2I, 2I-1, 2J, 2J-1, 2K, 2K-1, 2L, 2L-1, 2M, 2M-1, 2N, 2N-1, 2N-2, 2O, 2O-1, 2P, 2P-1, 2Q, 2Q-1, 2Q-2, 2R, 2R-1, 2R-2 are cross-sectional representations of various stages of forming a semiconductor device structure, in accordance with some embodiments of the disclosure.
Figure 2A:
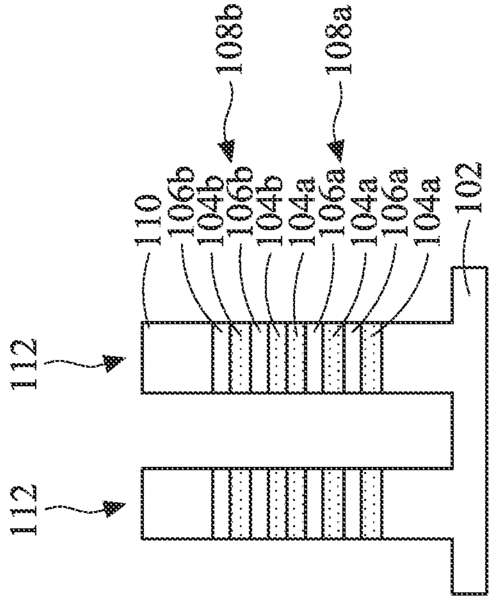

A first semiconductor stack 108*a* including first semiconductor material layers 104*a* and second semiconductor material layers 106*a* are formed over a substrate 102, as shown in FIG. 2A in accordance with some embodiments. The substrate 102 may be a semiconductor wafer such as a silicon wafer. The substrate 102 may also include other elementary semiconductor materials, compound semiconductor materials, alloy semiconductor materials, or a combination thereof. Examples of the elementary semiconductor materials may include, but are not limited to, crystal silicon, polycrystalline silicon, amorphous silicon, germanium, diamond, or a combination thereof. Examples of the compound semiconductor materials may include, but are not limited to, silicon carbide, gallium nitride, gallium arsenic, gallium phosphide, indium phosphide, indium arsenide, indium antimonide, or a combination thereof. Examples of the alloy semiconductor materials may include, but are not limited to, SiGe, GaAsP, AlInAs, AlGaAs, GaInAs, GaInP, GaInAsP, or a combination thereof. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 104*a* and second semiconductor material layers 106*a* are alternating stacked over the substrate 102 to form the first semiconductor stack 108*a*, as shown in FIG. 2A in accordance with some embodiments. The first semiconductor material layers 104*a* and the second semiconductor material layers 106*a* may include Si, Ge, SiGe, GaAs, InSb, GaP, GaSb, InAlAs, InGaAs, GaSbP, GaAsSb, InP, other III-V group materials, other II-VI group materials, other applicable materials, or a combination thereof. The first semiconductor material layers 104*a* and second semiconductor material layers 106*a* may be made of different materials with different etching rates. In some embodiments, the first semiconductor material layers 104*a* are made of SiGe and the second semiconductor material layers 106*a* are made of Si.

The first semiconductor material layers 104*a* and second semiconductor material layers 106*a* may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 104*a* and two layers of the second semiconductor material layers 106*a* shown in FIGS. 2A, the number of the first semiconductor material layers 104*a* and second semiconductor material layers 106*a* are not limited herein, depending on the demand of performance and process. For example, the semiconductor structure may include one to four, or more than four layers of the first semiconductor material layers 104*a* and one to four, or more than four layers of the second semiconductor material layers 106.

Next, a second semiconductor stack 108*b* including third semiconductor material layers 104*b* and fourth semiconductor material layers 106*b* are formed over the first semiconductor stack 108*a*, as shown in FIG. 2A in accordance with some embodiments. The processes for forming the third semiconductor material layers 104*b* and the fourth semiconductor material layers 106*b* may be the same as, or similar to, those used to form the first semiconductor material layers 104*a* and second semiconductor material layers 106*a*. For the purpose of brevity, the descriptions of these processes are not repeated herein. In some embodiments, the third semiconductor material layers 104*b* are made of SiGe and the fourth semiconductor material layers 106*b* are made of Si. In some embodiments, the concentration of Ge in the first semiconductor material layers 104*a* and the concentration of Ge in the third semiconductor material layers 104*b* are substantially the same.

Next, a mask structure 110 may be formed over the second semiconductor stack 108*b*. The mask structure 110 may be a multilayer structure including a pad layer and a hard mask layer formed over the pad layer. The pad layer may be made of silicon oxide, which may be formed by thermal oxidation or CVD. The hard mask layer may be made of silicon nitride, which may be formed by CVD, such as LPCVD or plasma-enhanced CVD (PECVD).

Afterwards, the first semiconductor stack 108*a* and the second semiconductor stack 108*b* are patterned to form fin structures 112 using the mask structure 110 as a mask layer, as shown in FIG. 2A in accordance with some embodiments. The fin structures 112 may include base fin structures, the first semiconductor stack 108*a* and the second semiconductor stack 108*b*, including the first semiconductor material layers 104*a*, the second semiconductor material layers 106*a*, the third semiconductor material layer 104*b*, and the fourth semiconductor material layer 106*b* formed over the base fin structure.

The patterning process may include forming a mask structure 110 over the first semiconductor stack 108*a* and the second semiconductor stack 108*b* and etching the first semiconductor stack 108*a*, the second semiconductor stack 108*b*, and the underlying substrate 102 through the mask structure 110.

The patterning process of forming the fin structures 112 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 112 are formed, a liner layer may be formed over the fin structures 112 and in the trenches between the fin structures 112. The liner layer may be conformally formed over the substrate 102, the fin structures 112, and the mask structure 110 covering the fin structures 112. A liner layer may be used to protect the fin structures 112 from being damaged in the following processes (such as an anneal process or an etching process). The liner layer may be made of silicon nitride. The liner layer may be formed using thermal oxidation, a CVD process, an atomic layer deposition (ALD) process, an LPCVD process, a plasma enhanced CVD (PECVD) process, an HDPCVD process, a flowable CVD (FCVD) process, another applicable process, or a combination thereof.

Next, an isolation material 116 is then filled into the trenches between the fin structures 112 and over the liner layer, as shown in FIG. 2B in accordance with some embodiments. The isolation material 116 may be made of silicon oxide, silicon nitride, silicon oxynitride (SiON), fluoride-doped silicate glass (FSG), other low-k dielectric materials, or a combination thereof. The isolation material 116 may be deposited by a deposition process, such as a chemical vapor deposition (CVD) process (e.g. a flowable CVD (FCVD) process), a spin-on-glass process, or another applicable process.

Next, the isolation material 116 is etched back using an etching process, and an isolation structure 116 is formed surrounding the base fin structure, as shown in FIG. 2B in accordance with some embodiments. The etching process may be used to remove the top portion of the isolation material 116. The isolation structure 116 may be a shallow trench isolation (STI) structure 116. The isolation structure 116 may be configured to electrically isolate active regions such as the fin structures 112 of the semiconductor structure 10*a* and prevent electrical interference and crosstalk.

Figure 2D:
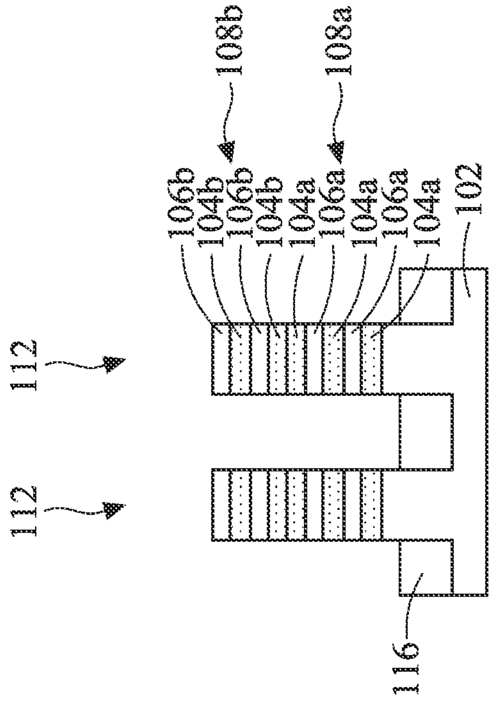
Figure 2C:
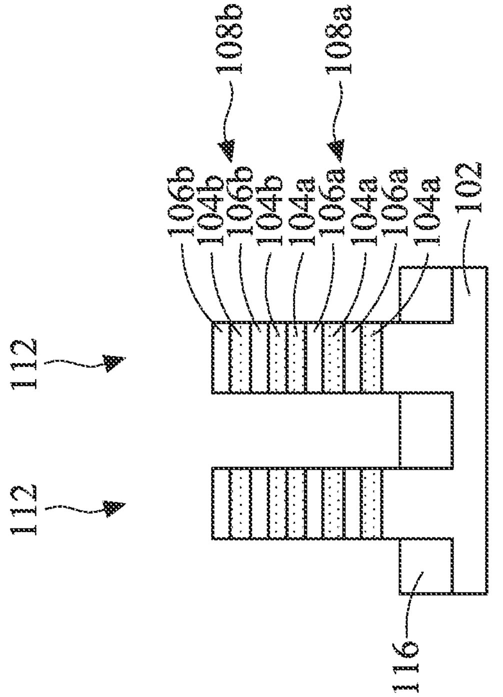

Next, the mask structure 110 over the fin structures 112 may be removed, as shown in FIG. 2C in accordance with some embodiments. As a result, the first semiconductor stack 108*a* and the second semiconductor stack 108*b* may be exposed.

Figures 1, 2D:
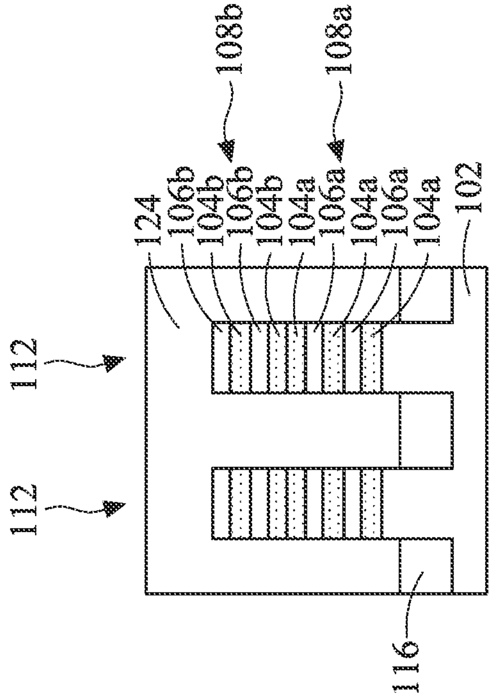

Next, a dummy gate structure 124 is formed over and across the fin structures 112, as shown in FIGS. 2D and 2D-1 in accordance with some embodiments. The dummy gate structure 124 may be used to define the source/drain regions and the channel regions of the resulting semiconductor structure 10*a*. The dummy gate structure 124 may include a dummy gate dielectric layer and a dummy gate electrode layer. The dummy gate dielectric layer and the dummy gate electrode layer may be replaced by the following steps to form a real gate structure with a high-k dielectric layer and a metal gate electrode layer.

The dummy gate dielectric layer may include one or more dielectric materials, such as silicon oxide, silicon nitride, silicon oxynitride (SiON), $HfO_2$, HfZrO, HfSiO, HfTiO, HfAlO, or a combination thereof. The dummy gate dielectric layer may be formed by an oxidation process (e.g., a dry oxidation process, or a wet oxidation process), a chemical vapor deposition process, other applicable processes, or a combination thereof. Alternatively, the dummy gate dielectric layer may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTIO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer may include polycrystalline-silicon (poly-Si), poly-crystalline silicon-germanium (poly-SiGe), other applicable materials, or a combination thereof. The dummy gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Next, a hard mask layer may be formed over the dummy gate structure 124. The hard mask layer may include multiple layers, such as an oxide layer and a nitride layer. In some embodiments, the oxide layer includes silicon oxide, and the nitride layer includes silicon nitride.

Figure 2E:
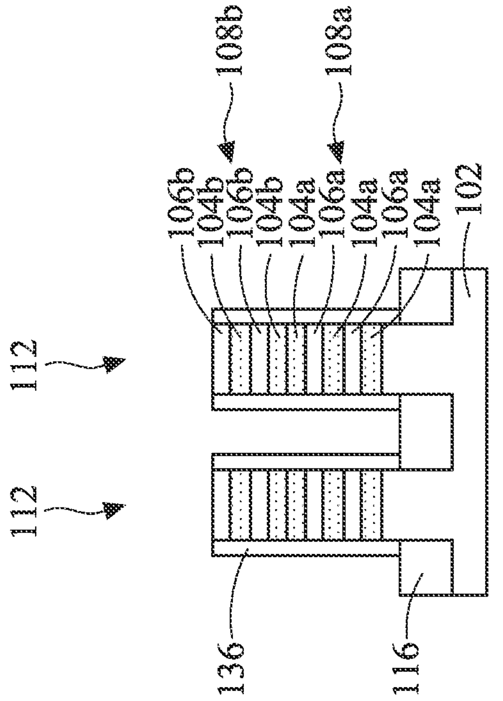
Figures 1, 2E:
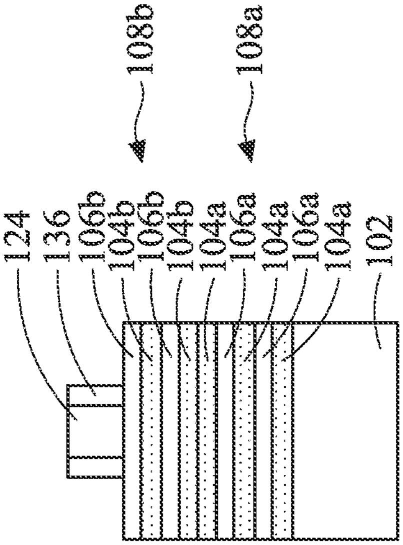

The formation of the dummy gate structure 124 may include conformally forming a dielectric material as the dummy gate dielectric layer. Afterwards, a conductive material may be formed over the dielectric material as the dummy gate electrode layer. The hard mask layer, including the oxide layer and the nitride layer, may be formed over the conductive material. Next, the dielectric material and the conductive material may be patterned and etched through the hard mask layer to form the dummy gate structure 124, as shown in FIGS. 2E and 2E-1 in accordance with some embodiments. The dummy gate dielectric layer and the dummy gate electrode layer may be etched by a dry etching process. After the etching process, the first semiconductor stack 108*a* and the second semiconductor stack 108*b* may be exposed at opposite sides of the dummy gate structure 124.

Next, a conformal dielectric layer is formed over the substrate 102 and the dummy gate structure 124, and then an etching process is performed. A pair of gate spacer layers 136 is formed over opposite sidewalls of the dummy gate structure 124, as shown in FIGS. 2E and 2E-1 in accordance with some embodiments The gate spacer layers 136 may be multi-layer structures formed by different materials with different etching selectivity. The gate spacer layers 136 may be made of silicon oxide, silicon nitride, silicon oxynitride, dielectric materials, or a combination thereof. The gate spacer layers 136 may be formed by a chemical vapor deposition (CVD) process, a spin-on-glass process, or another applicable process.

Figure 2F:
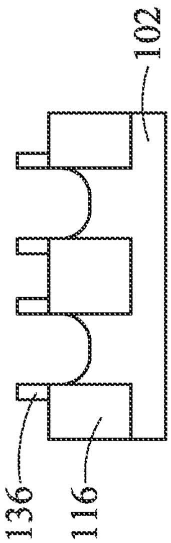

After the gate spacer layers 136 are formed, the first semiconductor stack 108*a* and the second semiconductor stack 108*b* not covered by the dummy gate structure 124 and the gate spacer layers 136 are etched to form the source/drain opening beside the dummy gate structure 124, as shown in FIGS. 2F and 2F-1 in accordance with some embodiments.

The fin structures 112 may be recessed by performing a number of etching processes. That is, the first semiconductor material layers 104*a*, the second semiconductor material layers 106*a*, the third semiconductor material layer 104*b*, and the fourth semiconductor material layer 106*b* of the fin structures 112 may be etched in different etching processes. The etching process may be a dry etching process or a wet etching process. The fin structures 112 may be etched by a dry etching process.

Next, the first semiconductor material layers 104*a* and the third semiconductor material layers 104*b* may be laterally etched from the source/drain opening to form recesses. The outer portions of the first semiconductor material layers 104*a* and the third semiconductor material layers 104*b* may be removed, and the inner portions of the first semiconductor material layers 104*a* and the third semiconductor material layers 104*b* under the dummy gate structure 124 and the gate spacer layers 136 may remain. After the lateral etching process, the sidewalls of the etched first semiconductor material layers 104*a* and the third semiconductor material layers 104*b* may be not aligned with the sidewalls of the second semiconductor material layers 106*a* and the fourth semiconductor material layers 106*b*.

The lateral etching of the first semiconductor material layers 104*a* and the third semiconductor material layers 104*b* may be a dry etching process, a wet etching process, or a combination thereof. In some embodiments, the first semiconductor material layers 104*a* and the third semiconductor material layers 104*b* are made of Ge or SiGe and the second semiconductor material layers 106*a* and the fourth semiconductor material layers 106*b* are made of Si, and the first semiconductor material layers 104*a* and the third semiconductor material layers 104*b* are selectively etched to form the recesses by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Figure 2G:
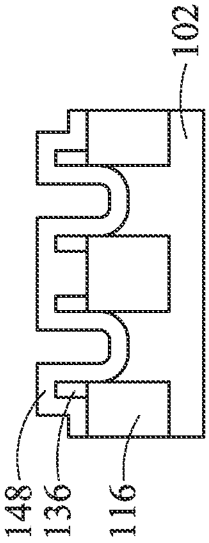
Figures 1, 2F:
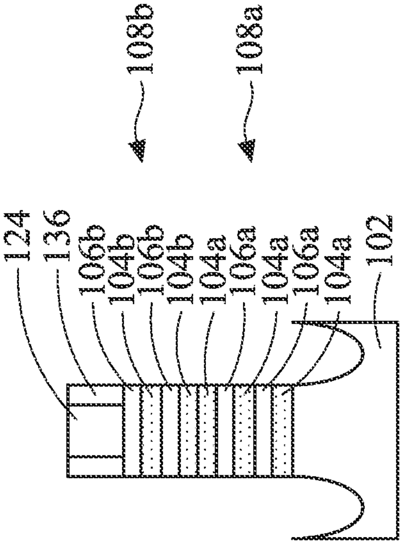

Next, an inner spacer layer 148 is conformally formed in the recess and the source/drain opening, as shown in FIGS. 2G and 2G-1 in accordance with some embodiments. The inner spacer layer 148 may be made of a dielectric material such as $SiO_2$, SiN, SiCN, SiCON, SiCO, AlO, HfO, other high dielectric constant material (for example, dielectric constant greater or equal to 7) or a combination thereof. The inner spacer layer 148 may be formed using a deposition process. The deposition process may include a CVD process (such as LPCVD, PECVD, SACVD, or FCVD), an ALD process, another applicable method, or a combination thereof.

In some embodiments, the inner spacer layer 148 fills up the space between the topmost second semiconductor material layer 106*a* and the bottommost fourth semiconductor material layer 106*b*.

Figure 2H:
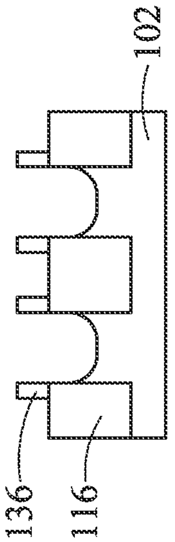
Figures 1, 2G:
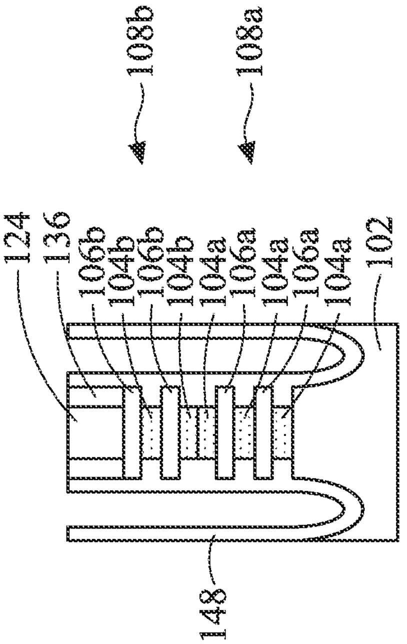

Afterwards, an etching process is performed, and the inner spacer layer 148 not covered by the dummy gate structure 124 and the gate spacer layers 136 is removed, and first inner spacers 148*a* and second inner spacers 148*b* are formed in the recess, as shown in FIGS. 2H and 2H-1 in accordance with some embodiments. In some embodiments, the first inner spacers 148*a* are formed beside the first semiconductor material layers 104*a*, and the second inner spacers 148*b* and formed beside the third semiconductor material layers 104*b*. The first inner spacers 148*a* and second inner spacers 148*b* may provide a barrier between subsequently formed source/drain epitaxial structures and gate structure.

Since the first inner spacers 148*a* and second inner spacers 148*b* may be formed of the same material, the boundary between the first inner spacers 148*a* and second inner spacers 148*b* is shown dashed line, as shown in FIG. 2H-1 in accordance with some embodiments.

Figure 2I:
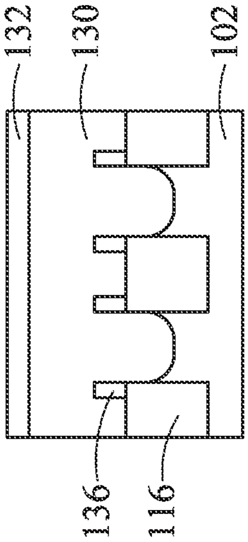
Figures 1, 2H:
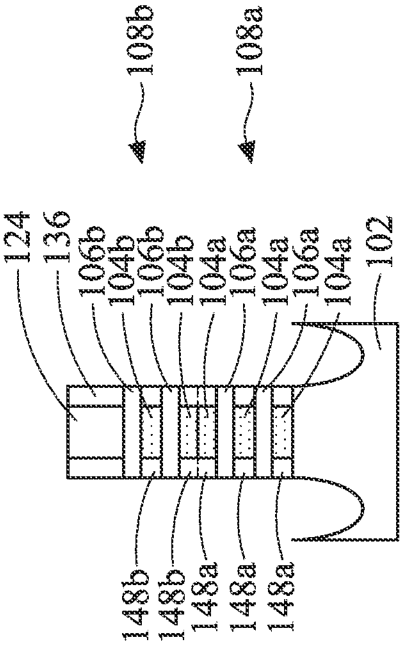

Next, dummy source/drain epitaxial structures 130 are formed in the source/drain opening, as shown in FIGS. 2I and 2I-1 in accordance with some embodiments. In some embodiments, the dummy source/drain epitaxial structures 130 are formed beside the first inner spacers 148*a* and the second semiconductor material layers 104*a*. The dummy source/drain epitaxial structures 130 may be made of spin-on carbon. The dummy source/drain epitaxial structures 130 may improve the photoresist selectivity to silicon during the etching process. The dummy source/drain epitaxial structures 130 may be formed using a deposition process and an etching process. The deposition process may include a CVD process (such as LPCVD, PECVD, SACVD, or FCVD), an ALD process, another applicable method, or a combination thereof. The etching process may be a dry etching process, a wet etching process, or a combination thereof.

Later, a cover layer 132 is formed over the dummy source/drain epitaxial structures 130, as shown in FIGS. 2I and 2I-1 in accordance with some embodiments. The cover layer 132 may be made of SiN, SiO2, SION, SiCN, SiCON, SiCO, high dielectric constant material (i.e. AlO, HfO, . . . ), other suitable materials, or a combination thereof. The cover layer 132 may be deposited by a CVD process (such as LPCVD, PECVD, SACVD, or FCVD), an ALD process, another applicable method, or a combination thereof.

Figure 2J:
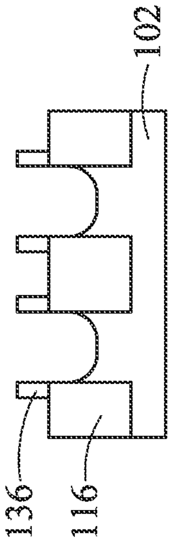
Figures 1, 2I:
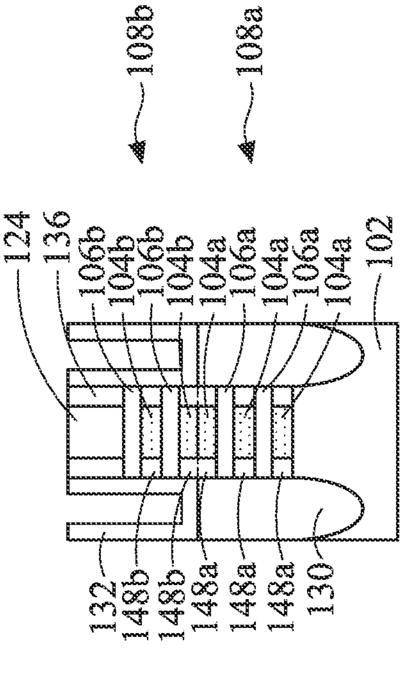

Next, the cover layer 132 is etched, and the dummy source/drain epitaxial structures 130 is removed, as shown in FIGS. 2J and 2J-1 in accordance with some embodiments. In some embodiments, the cover layer 132 remains over the sidewalls of the second inner spacers 148*b*, the fourth semiconductor material layer 106*b*, and the gate spacer layers 136. The etching process may be a dry etching process, a wet etching process, or a combination thereof.

Afterwards, the first inner spacers 148*a* is trimmed, and the end portion of the second semiconductor material layer 106*a* are exposed, as shown in FIGS. 2J and 2J-1 in accordance with some embodiments. In some embodiments, the first inner spacers 148*a* are thinner than the second inner spacers 148*b*. In some embodiments, the second semiconductor material layer 106*a* extends out of the sidewalls of the first inner spacers 148*a*. In some embodiments, the sidewalls of the first inner spacers 148*a* are misaligned with sidewalls of the second inner spacers 148*b*. In some embodiments, a portion of the top surfaces and bottom surfaces of the second semiconductor material layer 106*a* are exposed after trimming the first inner spacers 148*a*. In some embodiments, the second inner spacers 148*b* remain while partially etching the first inner spacers 148*a*. In some embodiments, the cover layer 132 remains after trimming the first inner spacers 148*a*. The first inner spacers 148*a* may be trimmed by a dry etching process, a wet etching process, or a combination thereof.

In some embodiments, the width difference of the first inner spacers 148*a* and the second inner spacers 148*b* is in a range of about 0.5 nm to about 4.0 nm. In some embodiments, the width difference of the second inner spacers 148*b* of the top transistor 100*b* and the first inner spacers 148*a* of the bottom transistor 100*a* is in a range of about 0.5 nm to about 4.0 nm. If the width difference is too great, the thinner inner spacers may be too thin, and the capacitance may be too great. In addition, subsequently formed gate structure and source/drain epitaxial structure may be electrically short. If the width difference is too less, the device performance may be worse.

In some embodiments, the second inner spacers 148*b* of transistor 100*b* are wider than the first inner spacers 148*a* of transistor 100*a*. Therefore, the capacitance of the transistor 100*b* may be reduced, and the on-current of the transistor 100*a* may be boosted.

Figure 2K:
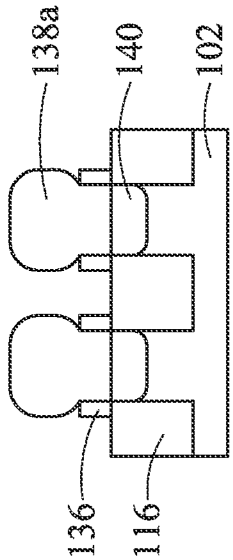
Figures 1, 2J:
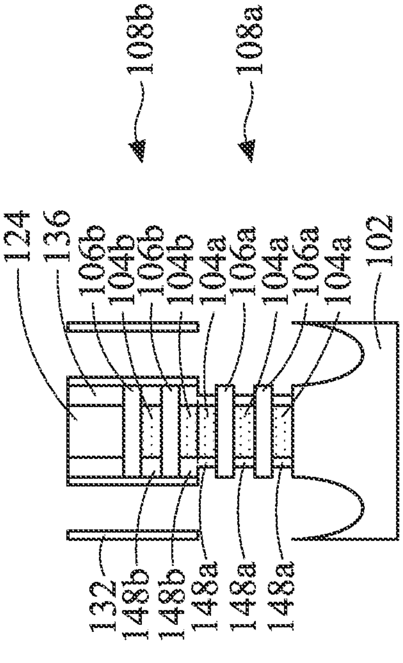

Next, a dielectric structure 140 is optionally formed in the source/drain opening, as shown in FIGS. 2K and 2K-1 in accordance with some embodiments. The dielectric structure 140 may provide isolation between the substrate 102 and the subsequently formed source/drain epitaxial structure. The dielectric structure 140 may be made of a dielectric material such as SiN, $SiO_2$, SION, SiCN, SiCON, SiCO, high dielectric constant material such as HfO, AlO, other applicable materials, or a combination thereof. The dielectric structure 140 may be formed by CVD, PVD, ALD, spin-on coating, or another applicable process.

Next, first source/drain epitaxial structures 138*a* is formed in the source/drain opening, as shown in FIGS. 2K and 2K-1 in accordance with some embodiments. The first source/drain epitaxial structures 138*a* may be formed over opposite sides of the second semiconductor material layer 106*a*. The first source/drain epitaxial structures 138*a* may refer to a source or a drain, individually or collectively dependent upon the context.

A strained material may be grown in the source/drain opening using an epitaxial (epi) process to form the first source/drain epitaxial structures 138*a*. In addition, the lattice constant of the strained material may be different from the lattice constant of the substrate 102. The first source/drain epitaxial structures 138*a* may include SiGeB, SiGe, other applicable materials, or a combination thereof. The first source/drain epitaxial structure 138*a* may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

The first source/drain epitaxial structures 138*a* may be in-situ doped during the epitaxial growth process. For example, the first source/drain epitaxial structures 138*a* may be the epitaxially grown SiGe doped with boron (B). The first source/drain epitaxial structures 138*a* may be doped in one or more implantation processes after the epitaxial growth process.

In some embodiments, the second inner spacers 148*b* cover a portion of the top surfaces of the first source/drain epitaxial structures 138*a*.

Figure 2L:
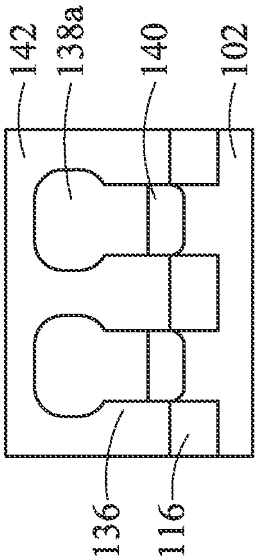
Figures 1, 2K:
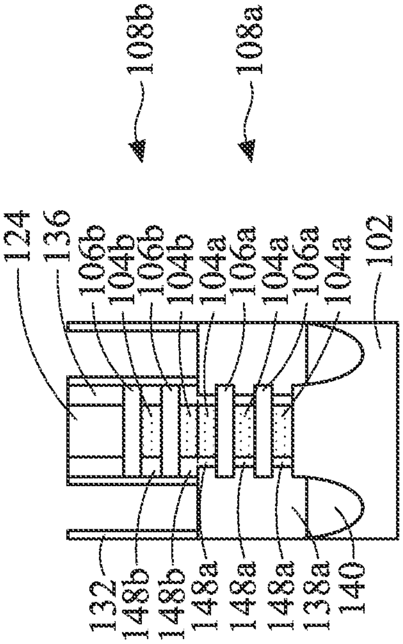
Figures 1, 2L:
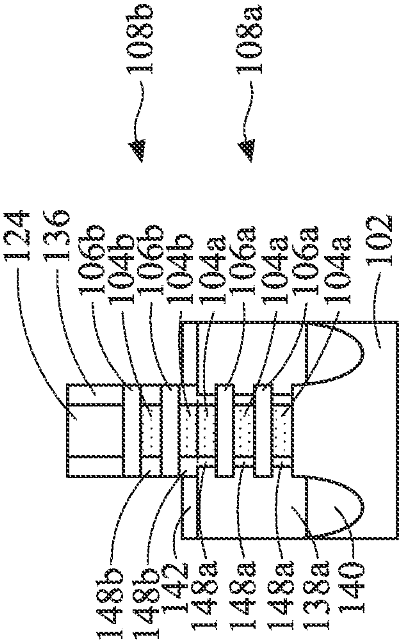

Next, the cover layer 132 is removed, and the sidewalls of the second inner spacers 148*b*, the fourth semiconductor material layer 106*b*, and the gate spacer layers 136 are exposed, as shown in FIGS. 2L and 2L-1 in accordance with some embodiments. The cover layer 132 may be removed by a dry etching process, a wet etching process, or a combination thereof.

Next, an isolation layer 142 is formed over the first source/drain epitaxial structures 138*a* in the source/drain opening, as shown in FIGS. 2L and 2L-1 in accordance with some embodiments. The isolation layer 142 may provide isolation between the first source/drain epitaxial structures 138*a* and the subsequently formed second source/drain epitaxial structures. The isolation layer 142 may be made of a dielectric material such as silicon nitride, silicon oxide, silicon oxynitride (SiON), other applicable materials, or a combination thereof. The isolation layer 142 may be formed by CVD, PVD, ALD, spin-on coating, or another applicable process. The isolation layer 142 may be formed by depositing the material of the isolation layer 142, and then etching back the isolation layer 142 to a desired height.

Figure 2M:
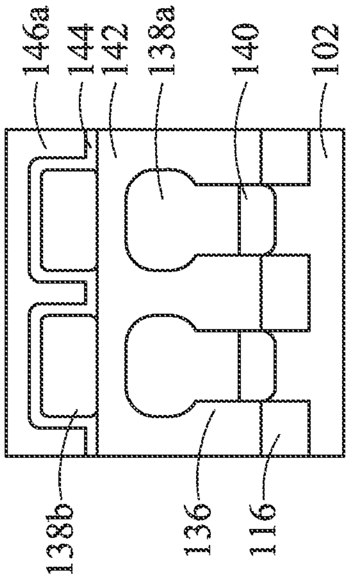

Next, second source/drain epitaxial structures 138*b* are formed in the source/drain opening over the isolation layer 142, as shown in FIGS. 2M and 2M-1 in accordance with some embodiments. In some embodiments, sidewalls of the first source/drain epitaxial structures 138*a* are misaligned with sidewalls of the second source/drain epitaxial structures 138*b*.

The second source/drain epitaxial structures 138*b* may include SiP, SiAs, other applicable materials, or a combination thereof. The second source/drain epitaxial structure 138*b* may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The processes for forming the second source/drain epitaxial structures 138*b* may be the same as, or similar to, those used to form the first source/drain epitaxial structures 138*a*. For the purpose of brevity, the descriptions of these processes are not repeated herein.

Next, an etch stop layer 144 may be formed over the second source/drain epitaxial structures 138*b*, as shown in FIGS. 2M and 2M-1 in accordance with some embodiments. More specifically, the etch stop layer 144 may cover the sidewalls of the gate spacer layers 136 and the top surface of the second source/drain epitaxial structures 138*b*. The etch stop layer 144 may be made of a dielectric material such as silicon nitride, silicon oxide, silicon oxynitride (SiON), other applicable materials, or a combination thereof. The etch stop layer 144 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the etch stop layer 144 is formed, a first inter-layer dielectric (ILD) structure 146*a* is formed over the etch stop layer 144 and the second source/drain epitaxial structures 138*b*, as shown in FIGS. 2M and 2M-1 in accordance with some embodiments.

The first ILD structure 146*a* may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 146*a* may be formed by chemical vapor deposition (CVD), physical vapor deposition (PVD), atomic layer deposition (ALD), spin-on coating, or another applicable process.

Afterwards, a planarizing process or an etch-back process may be performed on the first ILD structure 146*a* until the top surface of the dummy gate structure 124 is exposed. After the planarizing process, the top surface of the dummy gate structure 124 may be substantially level with the top surfaces of the gate spacer layers 136 and the first ILD structure 146*a*. The planarizing process may include a grinding process, a chemical mechanical polishing (CMP) process, an etching process, other applicable processes, or a combination thereof.

Figure 2N:
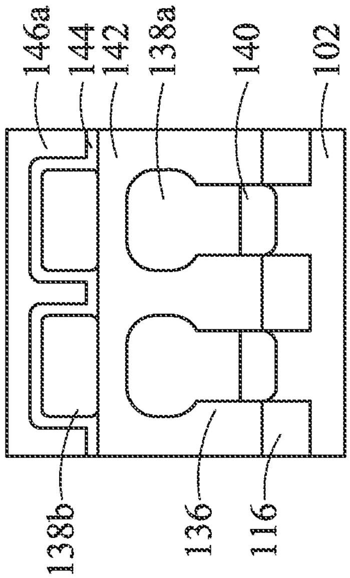
Figures 1, 2M:
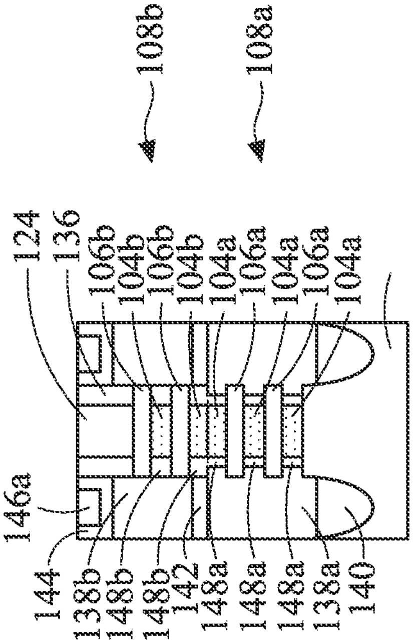
Figures 2, 2N:
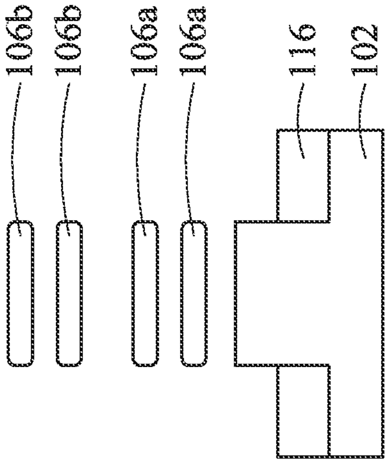
Figures 1, 2N:
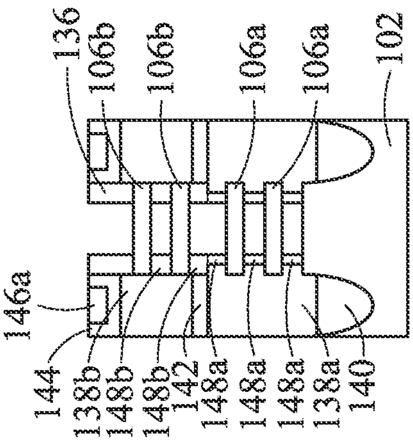

Next, the first semiconductor material layers 104*a* and the third semiconductor material layers 104*b* are removed and a gate opening may be formed between the second semiconductor material layers 106*a* and the fourth semiconductor material layers 106*b*, as shown in FIGS. 2N, 2N-1 and 2N-2 in accordance with some embodiments. More specifically, the second semiconductor material layers 106*a* and the fourth semiconductor material layers 106*b* exposed by the gate opening form nanostructures 106*a* and 106*b*, and the nanostructures 106*a* and 106*b* are configured to function as channel layers 106*a* and 106*b* in the resulting semiconductor devices 10*a* in accordance with some embodiments.

The first semiconductor material layers 104*a* and the third semiconductor material layers 104*b* may be removed by performing one or more etching processes. The etching process may include a selective wet etching process, such as APM (e.g., ammonia hydroxide-hydrogen peroxide-water mixture) etching process. The wet etching process uses etchants such as ammonium hydroxide ($NH_4OH$), TMAH, ethylenediamine pyrocatechol (EDP), potassium hydroxide (KOH) solutions, or a combination thereof.

Figures 1, 2O:
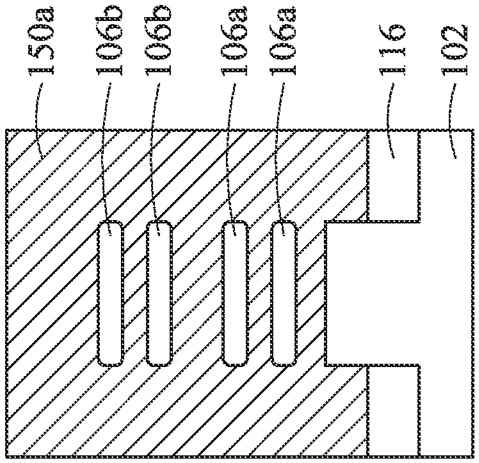
Figure 2O:
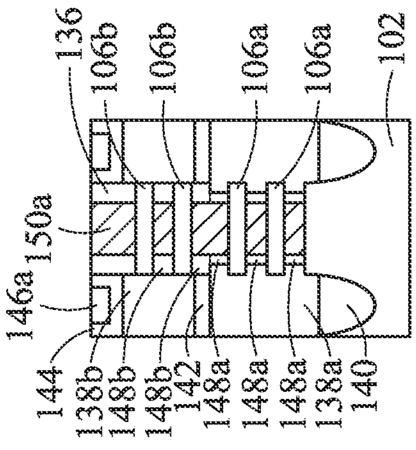

Next, first gate structures 150*a* are formed surrounding the nanostructures 106*a* and 106*b* and over the nanostructures 106*b*, as shown in FIGS. 2O and 2O-1 in accordance with some embodiments. The first gate structures 150*a* are formed surrounding the first nanostructures 106*a* to form gate-all-around (GAA) transistor structures. Therefore, the gate control ability may be enhanced.

The first gate structures 150*a* may be multi-layered structures. Each of the first gate structures 150*a* may include a first interfacial layer, a first gate dielectric layer, a first work function layer, and a first gate electrode layer.

The first interfacial layer may be formed around the nanostructures 106*a* and 106*b*, and also on the exposed portions of the base fin structures. The first interfacial layer may be made of silicon oxide, and the first interfacial layer may be formed by thermal oxidation.

The first gate dielectric layer may be formed over the first interfacial layer, so that the nanostructures 106*a* and 106*b* are surrounded (e.g. wrapped) by the first gate dielectric layer. In addition, the first gate dielectric layer also covers the sidewalls of the gate spacer layers 136 and the inner spacers 148*a* and 148*b* in accordance with some embodiments. The first gate dielectric layer may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, other applicable high-k dielectric materials, or a combination thereof. The first gate dielectric layer may be formed using CVD, ALD, other applicable methods, or a combination thereof.

Next, the first work function layer may be conformally formed over the first gate dielectric layer. The first work function layer may be made of a metal material. The metal material of the first work function layer may include a P-work-function metal. The P-work-function metal may include titanium nitride (TiN), tungsten nitride (WN), tantalum nitride (TaN), ruthenium (Ru), or a combination thereof. The first work function layer may be formed using CVD, ALD, other applicable methods, or a combination thereof.

Next, a first gate electrode layer may be formed over the first work function layer. The first gate electrode layer may be made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. The first gate electrode layer may be formed using CVD, ALD, electroplating, another applicable method, or a combination thereof. After the first gate electrode layer is formed, a planarization process such as CMP or an etch-back process may be performed.

Figures 1, 2P:
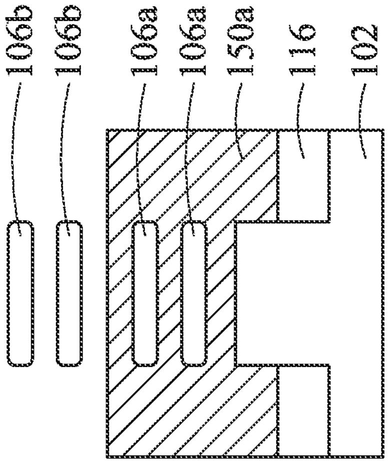
Figure 2P:
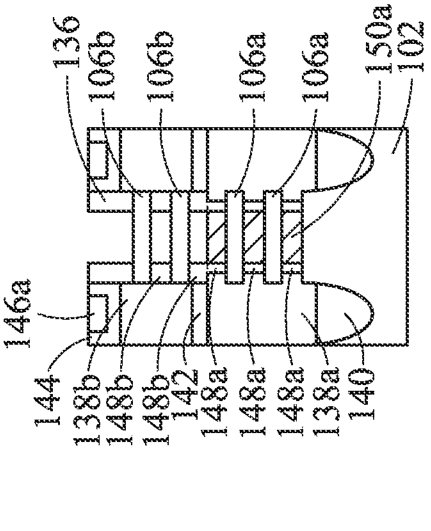

Next, the first gate structures 150*a* is etched back, and a gate opening is formed between the second inner spacers 148*b* and the gate spacer layers 136, as shown in FIGS. 2P and 2P-1 in accordance with some embodiments. The second nanostructures 106*b* are exposed from the gate opening after etching back the first gate structures 150*a*. The first gate structures 150*a* may be removed by a dry etching process, a wet etching process, or a combination thereof. The etching process may include vertical etching process and lateral etching process.

Figures 1, 2Q:
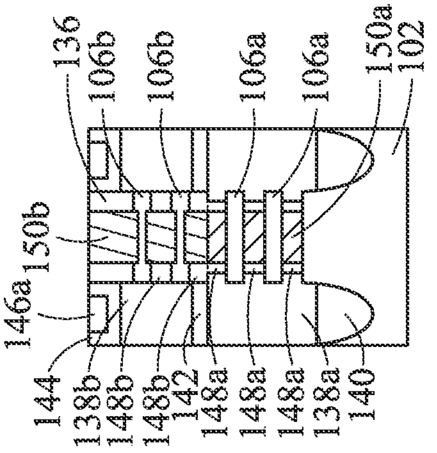
Figure 2Q:
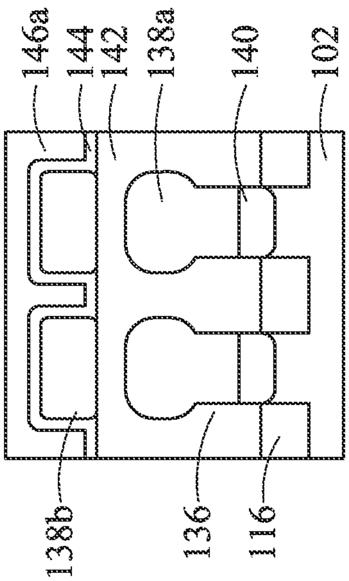
Figures 2, 2Q:
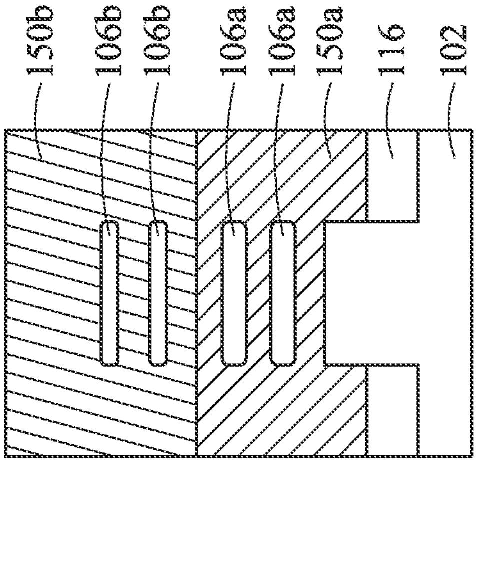

Next, second gate structures 150*b* are formed surrounding the second nanostructures 106*b* and over second nanostructures 106*b*, as shown in FIGS. 2Q, 2Q-1 and 2Q-2 in accordance with some embodiments. The second gate structures 150*b* are formed surrounding the second nanostructures 106*b* to form gate-all-around (GAA) transistor structures. Therefore, the gate control ability may be enhanced.

The second gate structures 150*b* may be multi-layered structures. Each of the second gate structures 150*b* may include a second interfacial layer, a second gate dielectric layer, a second work function layer, and a second gate electrode layer.

The processes and materials for forming the second interfacial layer and the second gate dielectric layer may be the same as, or similar to, those used to form the first interfacial layer and the first gate dielectric layer. For the purpose of brevity, the descriptions of these processes are not repeated herein.

Next, the second work function layer may be conformally formed over the second gate dielectric layer. The second work function layer may be made of a metal material. The metal material of the second work function layer may include an N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The second work function layer may be formed using CVD, ALD, other applicable methods, or a combination thereof.

It should be noted that, the conductivity type of the first work function layer and the second work function layer is merely an example. The first work function layer may include an N-work-function metal, and the second work function layer may include a P-work function metal. In some embodiments, the first work function layer and the second work function layer are with different conductivity types.

The processes and materials for forming the second gate electrode layer may be the same as, or similar to, those used to form the first gate electrode layer. For the purpose of brevity, the descriptions of these processes are not repeated herein.

Next, an opening may be formed in the first ILD structure 146*a* to expose the second source/drain epitaxial structure 138*b*. A barrier layer may be conformally formed over the bottom surface and the sidewalls of the opening. The barrier layer may be formed before filling the conductive material in the opening to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Next, a first silicide structure is formed in the second source/drain epitaxial structure 138*b*. The first silicide structure may reduce the contact resistance between the second source/drain epitaxial structure 138*b* and the subsequently formed contact structure over the second source/drain epitaxial structure 138*b*.

The first silicide structure may be made of TiSi, $Ti_5Si_4$, $TiSi_2$, NiSi, $NiSi_2$, CoSi, $CoSi_2$, $WSi_2$ and $MoSi_2$, or other suitable low-resistance materials. The first silicide structure may be formed over the second source/drain epitaxial structure 138*b* by forming a metal layer over the second source/drain epitaxial structure 138*b* first. The metal layer may react with the second source/drain epitaxial structure 138*b* in an annealing process and a silicide layer may be produced. Afterwards, the unreacted metal layer may be removed in an etching process and the first silicide structure may be formed over the second source/drain epitaxial structure 138*b*.

Figure 2R:
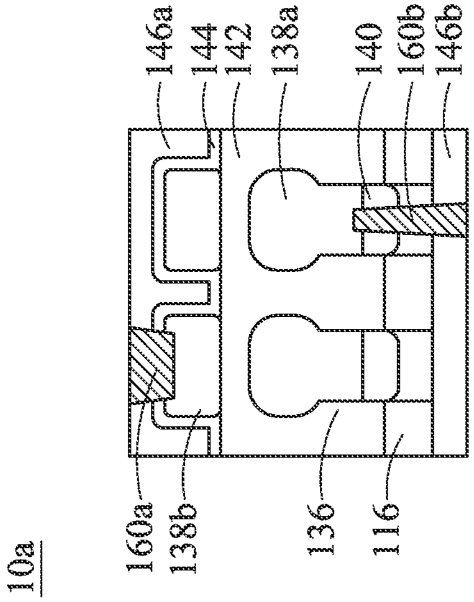
Figures 2, 2R:
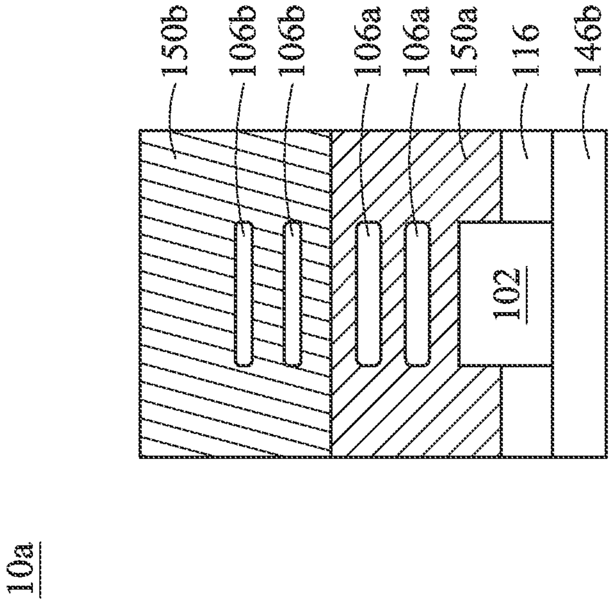
Figures 1, 2R:
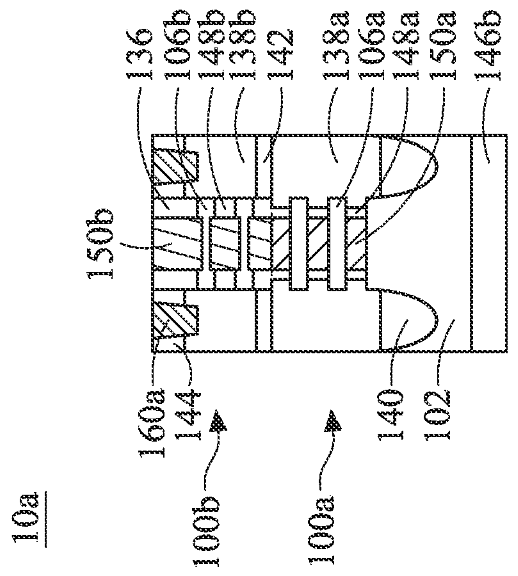

Afterwards, a first contact structure 160*a* is formed in the opening over the second source/drain epitaxial structure 138*b*, as shown in FIGS. 2R and 2R-1 in accordance with some embodiments.

The first contact structure 160*a* may be made of a metal material (e.g., Co, Ni, W, Ti, Ta, Cu, Al, Ru, Mo, TiN, TaN, or a combination thereof), metal alloys, poly-Si, other applicable conductive materials, or a combination thereof. In some embodiments, the first contact structure 160*a* is made of tungsten. The first contact structure 160*a* may be formed by a CVD process, a PVD process, an ALD process, an electroplating process, another suitable process, or a combination thereof to deposit the conductive materials of the first contact structure 160*a*. In some embodiments, the first contact structure 160*a* is formed by a PVD process.

Afterwards, a planarization process such as a chemical mechanical polishing (CMP) process or an etch back process is optionally performed to remove excess conductive materials. After the planarization process, the top surface of the first contact structure 160*a* may be level with the top surface of the gate spacer layers 136.

Next, the semiconductor device structure 10*a* may be flipped over, a planarization process may be performed, and a second ILD structure 146*b* is formed under the substrate 102 and the isolation structure 116, as shown in FIGS. 2R, 2R-1 and 2R-2 in accordance with some embodiments. Later, and an opening may be formed in the substrate 102 and second ILD structure 146*b* to expose the first source/drain epitaxial structure 138*a*, and a second silicide structure may be formed in the opening.

Afterwards, a second contact structure 160*b* is formed in the opening over the first source/drain epitaxial structure 138*a*, as shown in FIG. 2R in accordance with some embodiments. The material and the processes for forming the second ILD structure 146*b*, the second silicide structure, and second contact structure 160*b* may be the same as, or similar to, those used to form the first ILD structure 146*a*, the first silicide structure, and the first contact structure 160*a*. For the purpose of brevity, the descriptions of these processes are not repeated herein.

Afterwards, a planarization process such as a chemical mechanical polishing (CMP) process or an etch back process is optionally performed to remove excess conductive materials. After the planarization process, the bottom surface of the second contact structure 160*b* may be level with the bottom surface of the second ILD structure 146*b*.

By forming the first inner spacers 148*a* and the second inner spacers 148*b* with different widths, the device performance may be enhanced. With thicker inner spacers 148*b*, the capacitance may be reduced. With thinner inner spacers 148*a*, the on-current may be increased. The first inner spacers 148*a* may be trimmed before forming the first source/drain epitaxial structure 138*a*.

Many variations and/or modifications may be made to the embodiments of the disclosure. FIGS. 3A, 3A-1, 3B, 3B-1, 3C, 3C-1, 3D, 3D-1, 3D-2 are cross-sectional representations of various stages of forming a semiconductor device structure 10*b*. Some processes or devices are the same as, or similar to, those described in the embodiments above, and therefore the descriptions of these processes and devices are not repeated herein. The difference from the embodiments described above is that, as shown in FIGS. 3A-1 and 3B-1 in accordance with some embodiments, the first inner spacers 148*a* are not trimmed, and the second inner spacers 148*b* are trimmed after forming the isolation layer 142.

Figures 1, 3A:
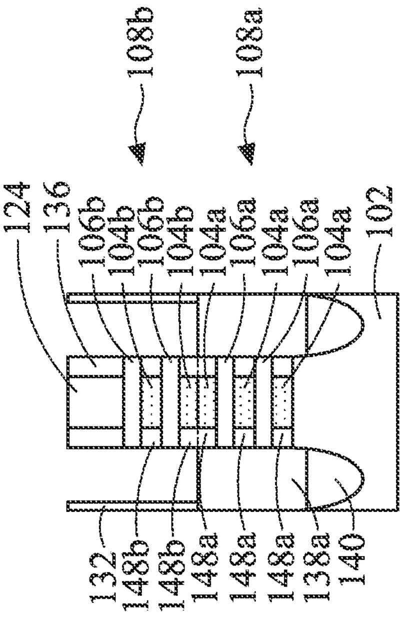
Figure 3A:
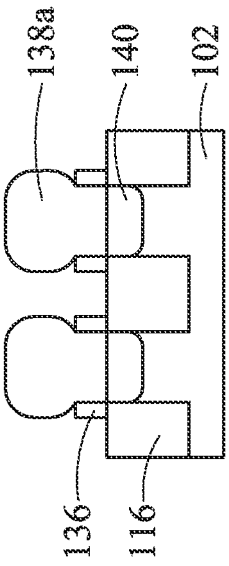

The first inner spacers 148*a* are not trimmed before forming the first source/drain epitaxial structure 138*a*, as shown in FIG. 3A-1 in accordance with some embodiments. In some embodiments, the sidewalls of the first inner spacers 148*a* are substantially aligned with the sidewalls of the second semiconductor material layers 106*a*.

Figure 3B:
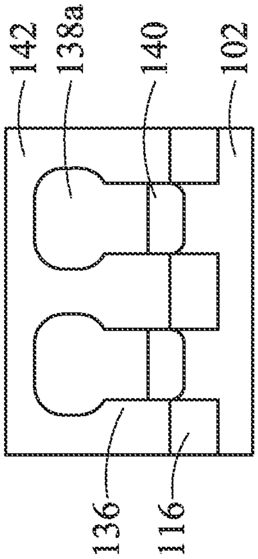
Figures 1, 3B:
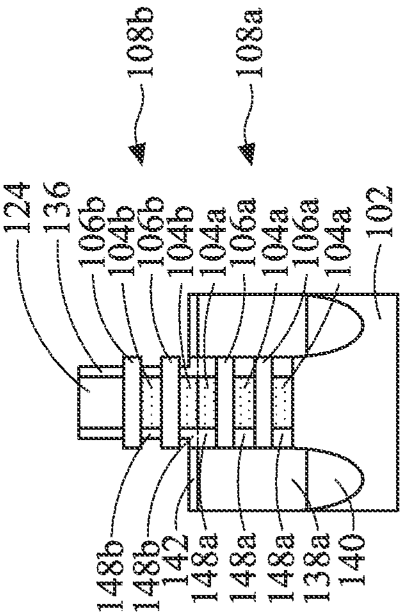

Afterwards, after the isolation layer 142 is formed, the second inner spacers 148*b* and the gate spacer layers 136 are trimmed, as shown in FIG. 3B-1 in accordance with some embodiments. The end portion of the second channel layers 106*b* are exposed, as shown in FIG. 3B-1 in accordance with some embodiments. The second inner spacers 148*b* may be trimmed by a dry etching process, a wet etching process, or a combination thereof.

In some embodiments, the top surface of the isolation layer 142 is substantially aligned with the topmost surface of the first inner spacers 148*a*. In some embodiments, the second inner spacers 148*b* are thinner than the first inner spacers 148*a*. In some embodiments, the second channel layers 106*b* extends out of the sidewalls of the second inner spacers 148*b*. In some embodiments, the sidewalls of the second inner spacers 148*b* are substantially aligned with the sidewalls of the gate spacer layers 136. In some embodiments, the gate spacer layers 136 and the first inner spacers 148*a* have different widths.

Figures 1, 3C:
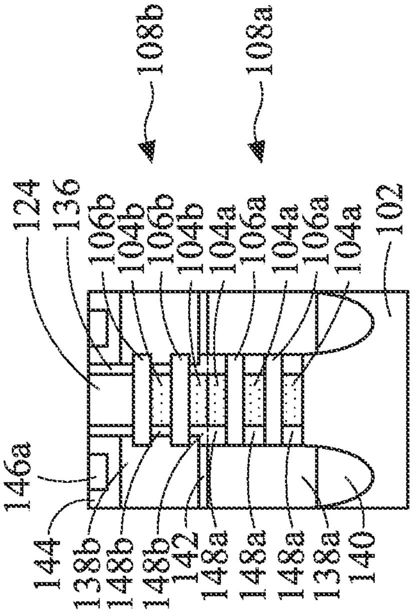
Figure 3C:
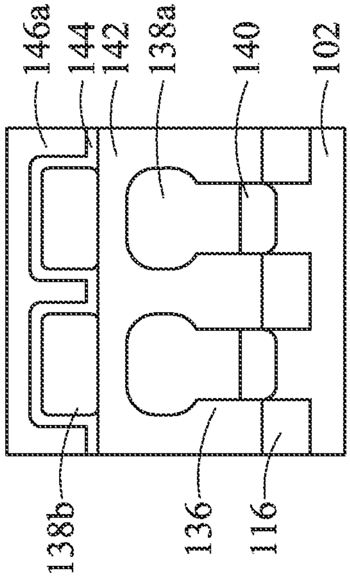

Next, the second source/drain epitaxial structure 138*b* is formed in the source/drain opening over the isolation layer 142, as shown in FIGS. 3C and 3C-1 in accordance with some embodiments. In some embodiments, the second channel layers 106*b* extends in the second source/drain epitaxial structure 138*b*. In some embodiments, the second source/drain epitaxial structure 138*b* is wrapped around the end portions of the second channel layers 106*b*.

Figures 1, 3D:
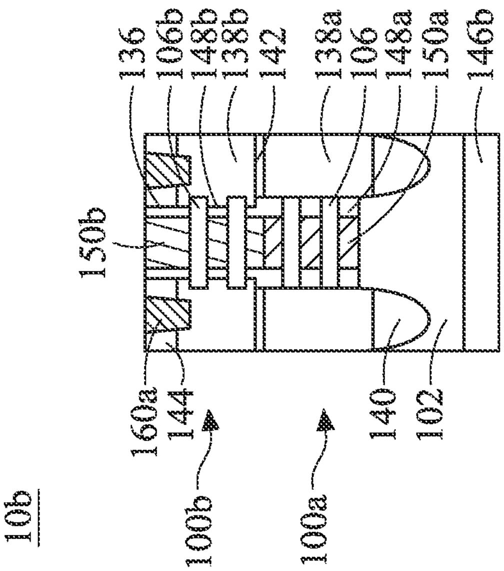
Figure 3D:
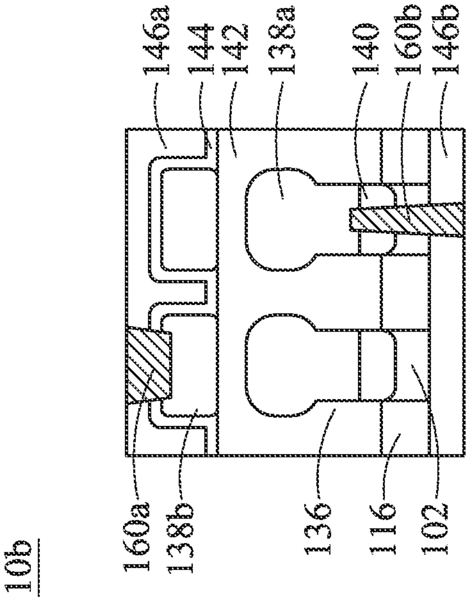
Figures 2, 3D:
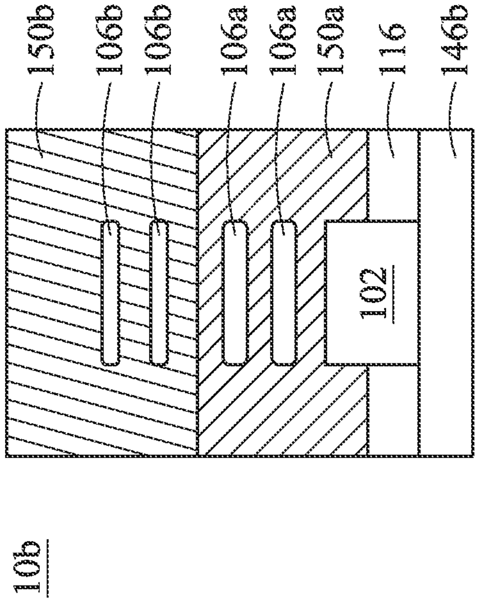

Afterwards, the etch stop layer 144 and the first ILD structure 146*a* are formed over the second source/drain epitaxial structure 138*b*, and the gate structures 150*a* and 150*b* are formed between the inner spacers 148*a* and 148*b*, respectively, as shown in FIGS. 3D, 3D-1 and 3D-1 in accordance with some embodiments. Moreover, the first contact structure 160*a* and the second contact structure 160*b* are formed connected to the first source/drain epitaxial structure 138*a* the second source/drain epitaxial structure 138*b*, respectively.

The material and the processes for forming the etch stop layer 144, the first ILD structure 146*a*, the gate structures 150*a* and 150*b*, and the contact structures 160*a* and 160*b* may be the same as, or similar to, those used to form the etch stop layer 144, the first ILD structure 146*a*, the gate structures 150*a* and 150*b*, and the contact structures 160*a* and 160*b* in the previous embodiments. For the purpose of brevity, the descriptions of these processes are not repeated herein.

By forming the first inner spacers 148*a* and the second inner spacers 148*b* with different widths, the device performance may be enhanced. With thicker inner spacers 148*a*, the capacitance may be reduced. With thinner inner spacers 148*b*, the on-current may be increased. The second inner spacers 148*b* may be trimmed after forming the isolation layer 142.

Many variations and/or modifications may be made to the embodiments of the disclosure FIGS. 4A, 4A-1, 4B, 4B-1, 4B-2, 4C, 4C-1, 4D, 4D-1, 4E, 4E-1, 4F, 4F-1, 4F-2, 4G, 4G-1, 4G-2 are cross-sectional representations of various stages of forming a semiconductor device structure 10*c*. Some processes or devices are the same as, or similar to, those described in the embodiments above, and therefore the descriptions of these processes and devices are not repeated herein. The difference from the embodiments described above is that, as shown in FIG. 4E in accordance with some embodiments, the second inner spacers 148*b* and the gate spacer layer 136 are further etched before forming the second gate structure 150*b*.

Figure 4A:
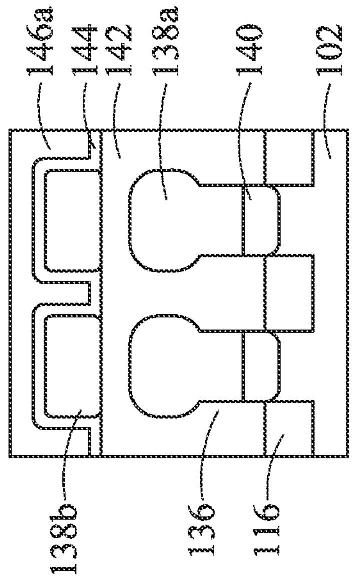
Figure 4B:
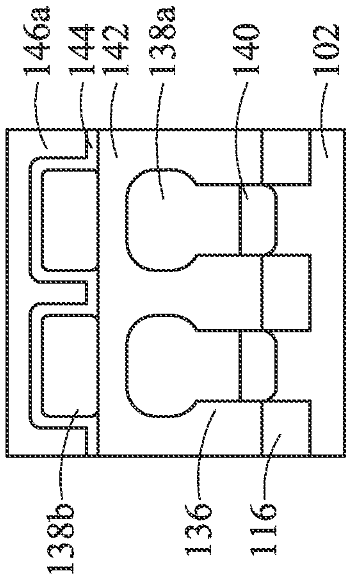
Figures 1, 4A:
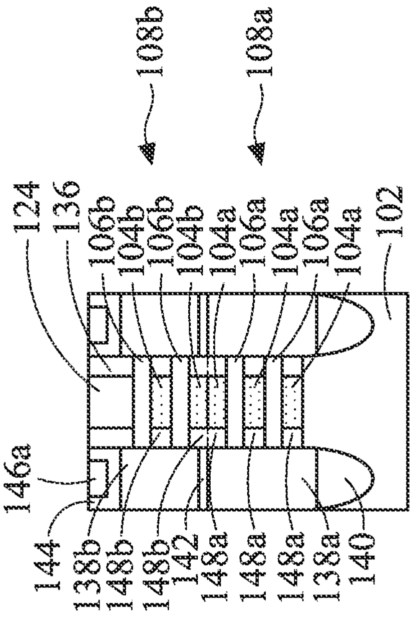
Figures 1, 4B:
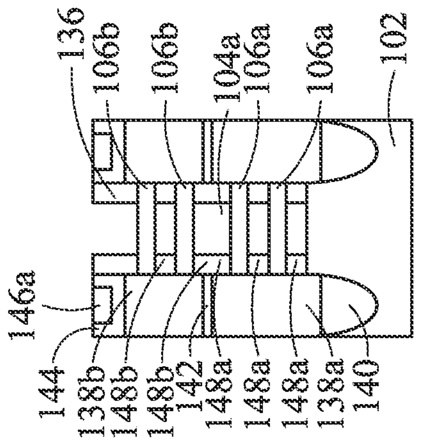
Figures 2, 4B:
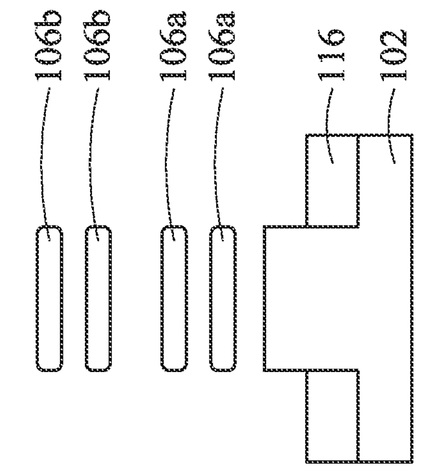
Figures 1, 4C:
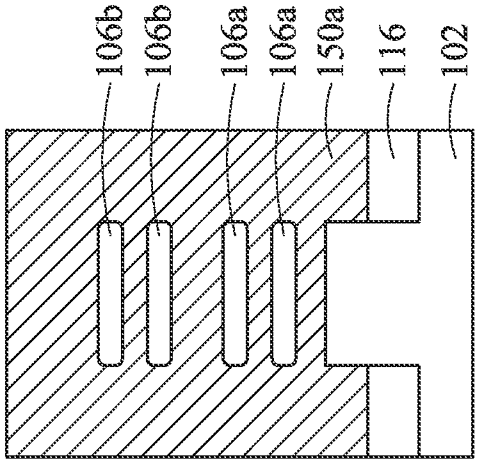
Figure 4C:
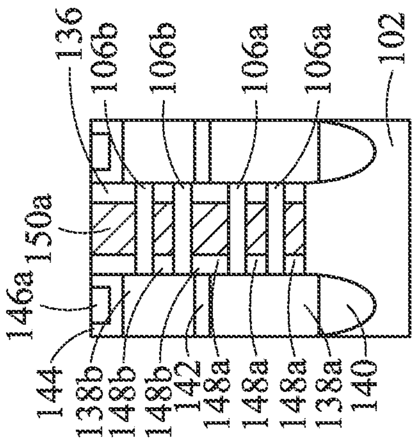
Figures 1, 4D:
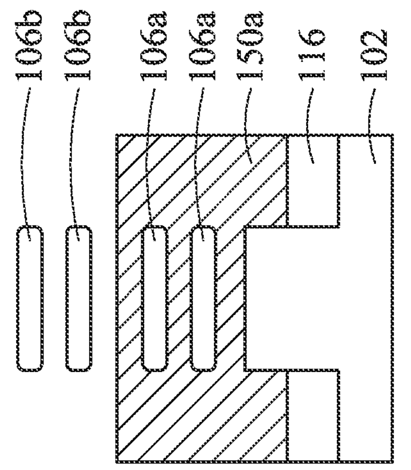
Figure 4D:
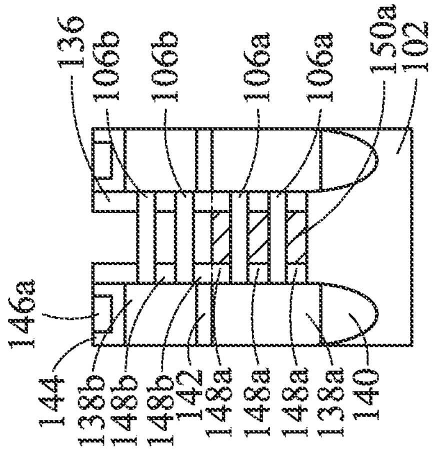

The first inner spacers 148*a* and the second inner spacers 148*b* are not trimmed before forming the first source/drain epitaxial structure 138*a* and the second source/drain epitaxial structure 138*b*, as shown in FIGS. 4A and 4A-1 in accordance with some embodiments. In some embodiments, the sidewalls of the first inner spacers 148*a* and the second inner spacers 148*b* are substantially aligned with the sidewalls of the second semiconductor material layers 106*a* and the fourth semiconductor material layers 106*b*, respectively.

Next, the dummy gate structure 124 is removed, and the first gate structure 150*a* is formed in the gate opening. Later, the first gate structure 150*a* is etched back, and the second inner spacers 148*b* are exposed, as shown in FIGS. 4B, 4B-1, 4B-2, 4C, 4C-1, 4D, 4D-1 in accordance with some embodiments.

Figures 1, 4E:
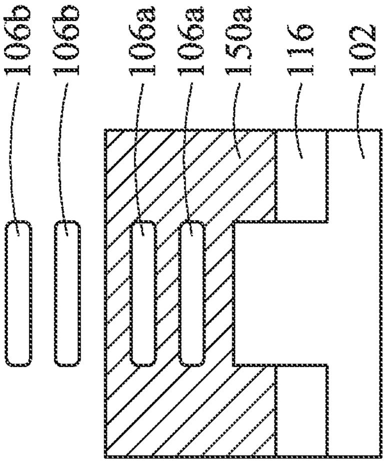
Figure 4E:
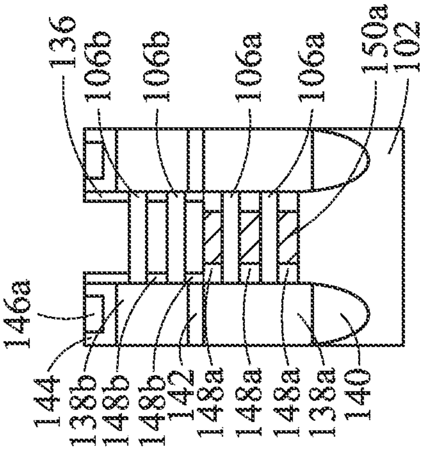

Next, the second inner spacers 148*b* and the gate spacer layer 136 are further etched, as shown in FIGS. 4E and 4E-1 in accordance with some embodiments. The second inner spacers 148*b* and the gate spacer layer 136 may be etched by a dry etching process, a wet etching process, or a combination thereof.

Figures 1, 4F:
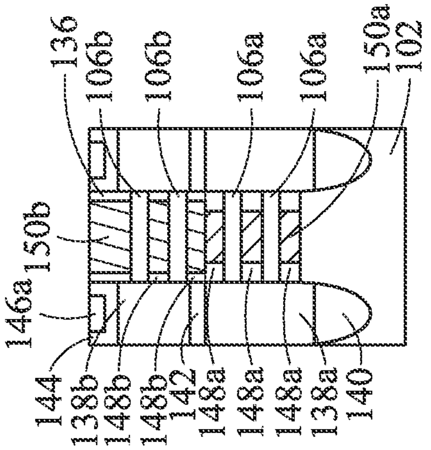
Figure 4F:
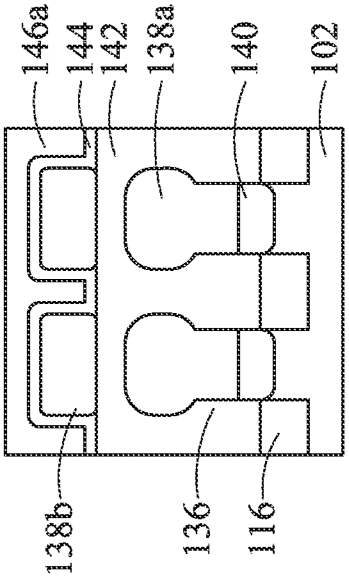
Figure 4G:
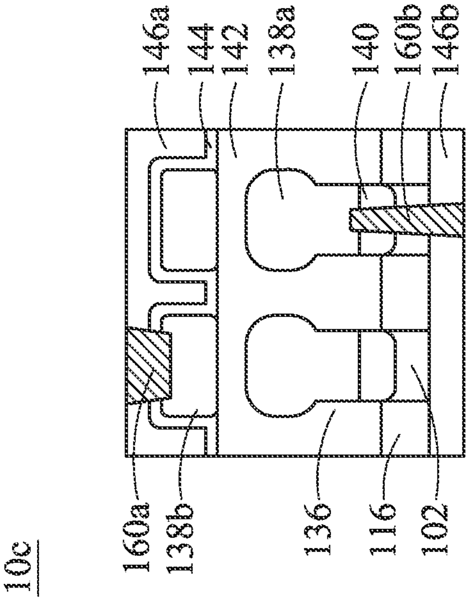
Figures 2, 4F:
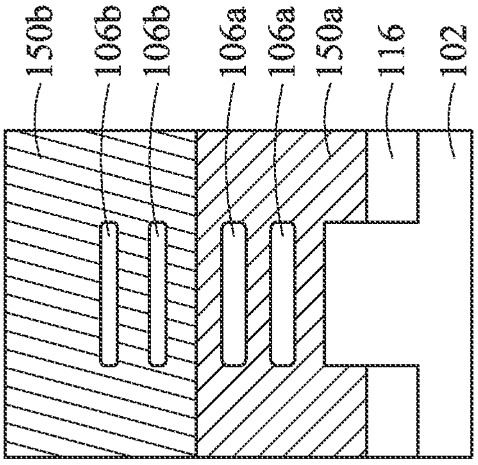
Figures 1, 4G:
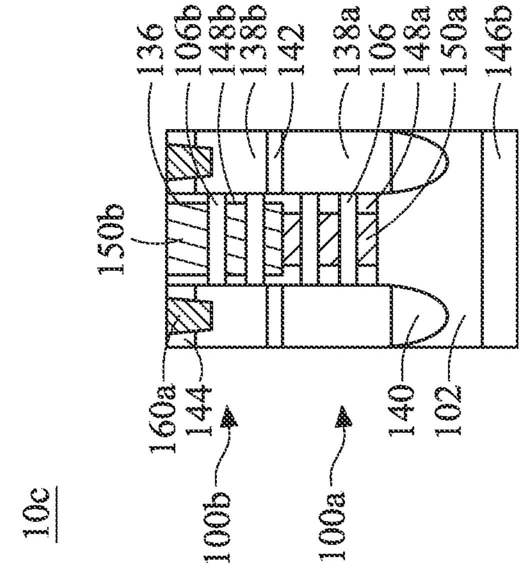
Figures 2, 4G:
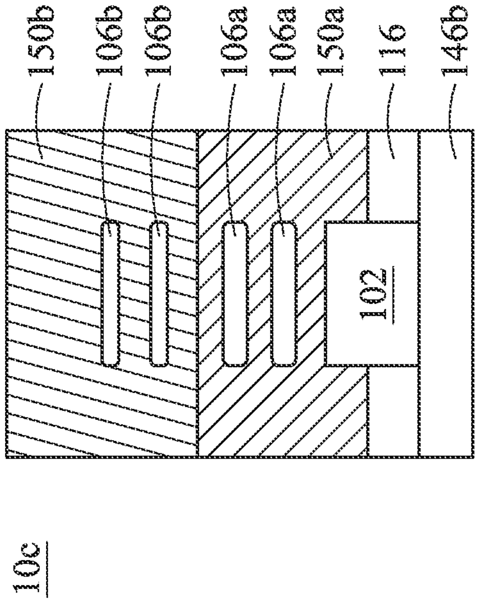

After the second inner spacers 148*b* and the gate spacer layer 136 are etched, the second gate structure 150*b* is formed in the gate opening, as shown in FIGS. 4F, 4F-1, 4F-2 in accordance with some embodiments. In some embodiments, the second gate structure 150*b* covers a portion of the first inner spacers 148*a*.

Afterwards, the first contact structure 160*a* and the second contact structure 160*b* are formed over the first source/drain epitaxial structure 138*a* and the second source/drain epitaxial structure 138*b*.

In some embodiments, the width difference of the first gate structure 150*a* and the second gate structure 150*b* is in a range of about 0.5 nm to about 4.0 nm. If the width difference is too great, the thinner inner spacers may be too thin, and the capacitance may be too great. In addition, subsequently formed gate structure and source/drain epitaxial structure may be electrically short.

In some embodiments, the second gate structure 150*b* is wider than the first gate structure 150*a*. The Drain-induced barrier lowering (DIBL) of the second transistor 100*b* may be improved.

By forming the first inner spacers 148*a* and the second inner spacers 148*b* with different widths, the device performance may be enhanced. With thicker inner spacers 148*b*, the capacitance may be reduced. With thinner inner spacers 148*a*, the on-current may be increased. The second inner spacers 148*b* may be etched before forming the second gate structure 150*b*. The first gate structure 150*a* and the second gate structure 150*b* may have different widths.

Many variations and/or modifications may be made to the embodiments of the disclosure. FIGS. 5A, 5B, 5B-1, 5C, 5D, 5D-1, 5D-2 are cross-sectional representations of various stages of forming a semiconductor device structure 10*d*. Some processes or devices are the same as, or similar to, those described in the embodiments above, and therefore the descriptions of these processes and devices are not repeated herein. The difference from the embodiments described above is that, as shown in FIG. 5A in accordance with some embodiments, the concentration of Ge in the first semiconductor material layers 104*a* and the concentration of Ge in the third semiconductor material layers 104*b* are different.

In some embodiments, the first semiconductor material layers 104*a* and the third semiconductor material layers 104*b* includes SiGe. In some embodiments, the concentration of Ge in the first semiconductor material layers 104*a* is in a range of about 20% to about 100%, and the concentration of Ge in the third semiconductor material layers 104*b* is in a range of about 10% to about 40%. The etching rate during the lateral etching of the first semiconductor material layers 104*a* and the third semiconductor material layers 104*b* from the source/drain openings may be different. With greater concentration of Ge, the etching rate is greater.

Figure 5B:
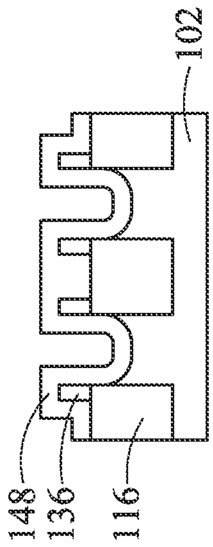
Figure 5A:
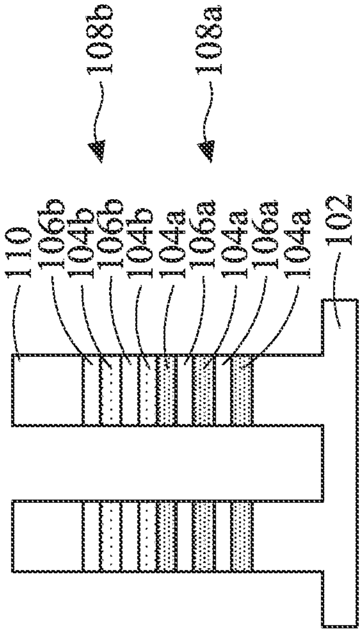
Figure 5C:
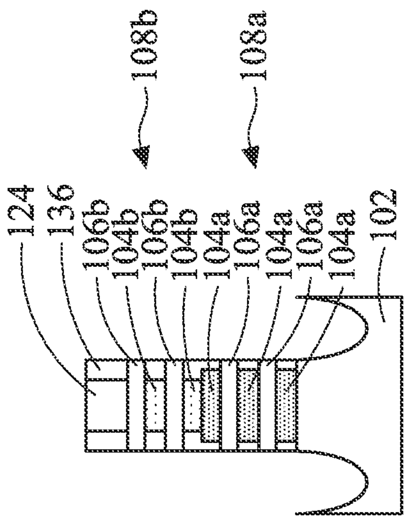
Figures 1, 5B:
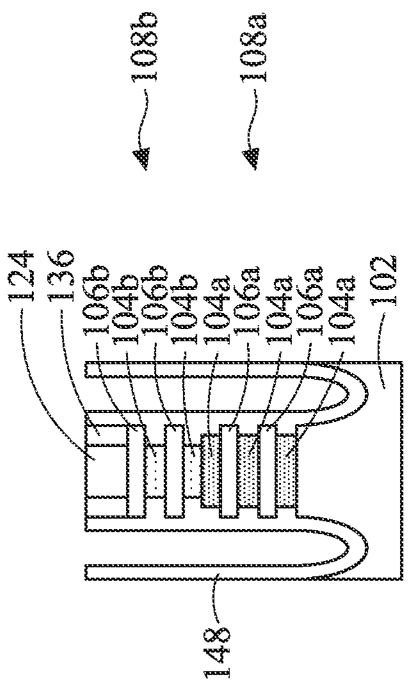

Next, the first semiconductor material layers 104*a* and the third semiconductor material layers 104*b* may be laterally etched, and the inner spacer layer 148 is deposited in the source/drain opening, as shown in FIGS. 5B and 5B-1 in accordance with some embodiments. Since the concentration of Ge of the first semiconductor material layers 104*a* and the third semiconductor material layers 104*b* are different, the etching rate of the first semiconductor material layers 104*a* and the third semiconductor material layers 104*b* may be different. Therefore, the recess amount of the first semiconductor material layers 104*a* and the third semiconductor material layers 104*b* may be different.

Next, an etching process is performed, and the first inner spacers 148*a* and the second inner spacers 148*b* are formed beside the first semiconductor material layers 104*a* and the third semiconductor material layers 104*b*, respectively. In some embodiments, since the concentration of Ge of the first semiconductor material layers 104*a* and the third semiconductor material layers 104*b* are different, the first inner spacers 148*a* and the second inner spacers 148*b* have different widths.

Figure 5D:
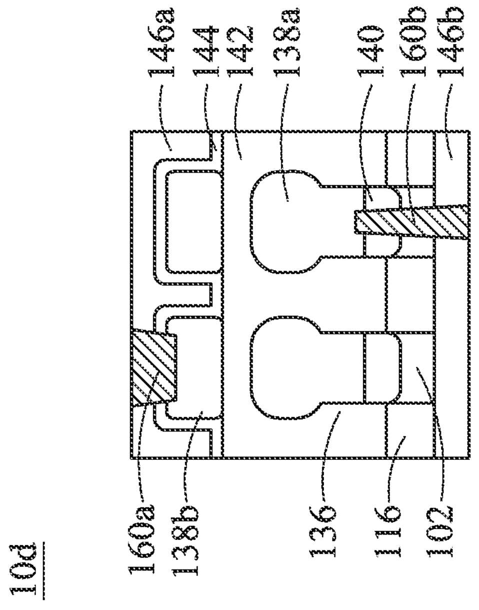
Figures 1, 5D:
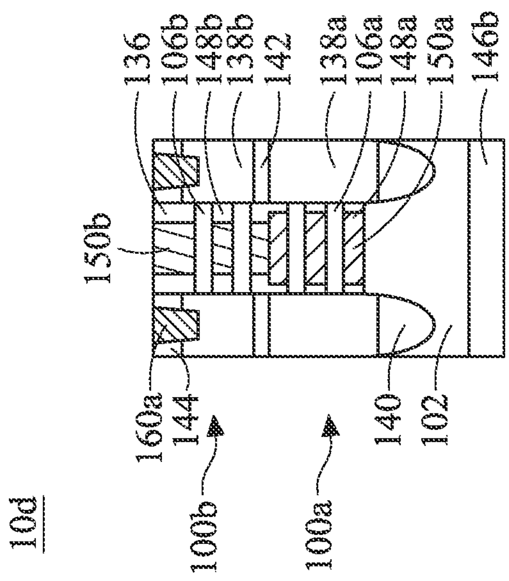
Figures 2, 5D:
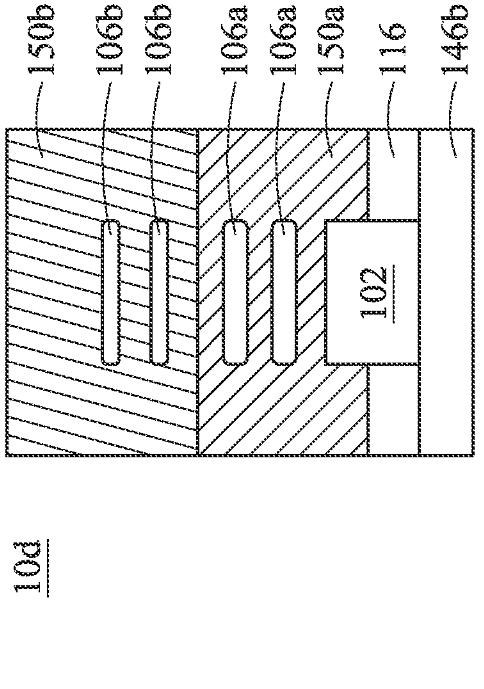

Afterwards, the first semiconductor material layers 104*a* and the third semiconductor material layers 104*b* are removed, and the first gate structure 150*a* and the second gate structure 150*b* are formed, and the first contact structure 160*a* and the second contact structure 160*b* are formed over the first source/drain epitaxial structure 138*a* and the second source/drain epitaxial structure 138*b*, as shown in FIGS. 5D, 5D-1 and 5D-2 in accordance with some embodiments.

In some embodiments, the first gate structure 150*a* is wider than the second gate structure 150*b*. In some embodiments, the width difference between the second gate structure 150*b* and the first gate structure 150*a* is in a range of about 0.5 nm to about 4.0 nm. The Drain-induced barrier lowering (DIBL) of the first transistor 100*a* may be improved.

By forming the first inner spacers 148*a* and the second inner spacers 148*b* with different widths, the device performance may be enhanced. With thicker inner spacers 148*b*, the capacitance may be reduced. With thinner inner spacers 148*a*, the on-current may be increased. The inner spacers 148*a* and 148*b* with different widths may be formed by forming the first semiconductor material layers 104*a* and the third semiconductor material layers 104*b* with different concentrations of Ge.

Figure 6A:
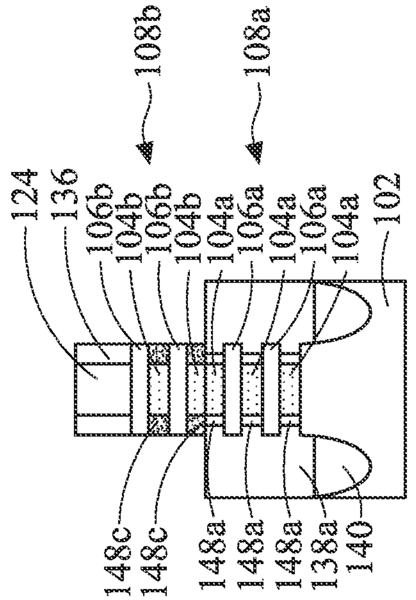
FIGS. 6A, 6B are cross-sectional representations of various stages of forming a semiconductor device structure, in accordance with some embodiments of the disclosure.
Figure 6B:
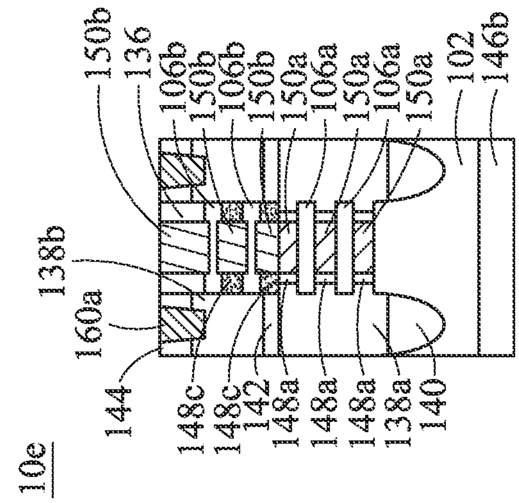

Many variations and/or modifications may be made to the embodiments of the disclosure. FIGS. 6A and 6B are cross-sectional representations of various stages of forming a semiconductor device structure 10*e*. Some processes or devices are the same as, or similar to, those described in the embodiments above, and therefore the descriptions of these processes and devices are not repeated herein. The difference from the embodiments described above is that, as shown in FIG. 6A in accordance with some embodiments, the, the inner spacers 148*c* beside the third semiconductor material layers 104*b* and the first inner spacers 148*a* are made of different materials.

After forming the first source/drain epitaxial structure 138*a*, the second inner spacer layer 148*b* beside the third semiconductor material layer 104*b* is removed, and third inner spacers 148*c* are formed beside the third semiconductor material layer 104*b*. The third inner spacers 148*c* may be formed by conformally depositing the third inner spacer layer 148*c* in the recess and the source/drain opening, and the third inner spacer layer 148*c* not covered by the dummy gate structure 124 and the gate spacer layers 136 may be removed.

The third inner spacer layer 148*c* may be made of $SiO_2$, SiN, SiCN, SiCON, SiCO, AlO, HfO, other high dielectric constant material (for example, dielectric constant greater or equal to 7) or a combination thereof. In some embodiments, the first inner spacers 148*a* and the third inner spacers 148*c* are made of different materials. With harder material such as SiN, the inner spacers 148*a* and 148*c* may resist breakage during the following processes. With lower dielectric constant material such as SiCON, the capacitance may be reduced.

By forming the first inner spacers 148*a* and the third inner spacers 148*c* with different widths, the device performance may be enhanced. Thicker inner spacers 148*c* may reduce the capacitance. Thinner inner spacers 148*a* may increase the on-current. The inner spacers 148*a* and 148*c* may be made of different materials. With harder material, the inner spacers 148*a* and 148*c* may resist breakage. With lower dielectric constant material, the capacitance may be reduced.

Figure 7A:
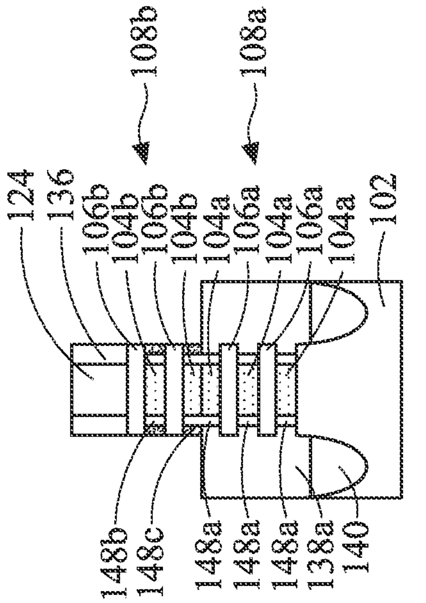
FIGS. 7A, 7B are cross-sectional representations of various stages of forming a semiconductor device structure, in accordance with some embodiments of the disclosure.
Figure 7B:
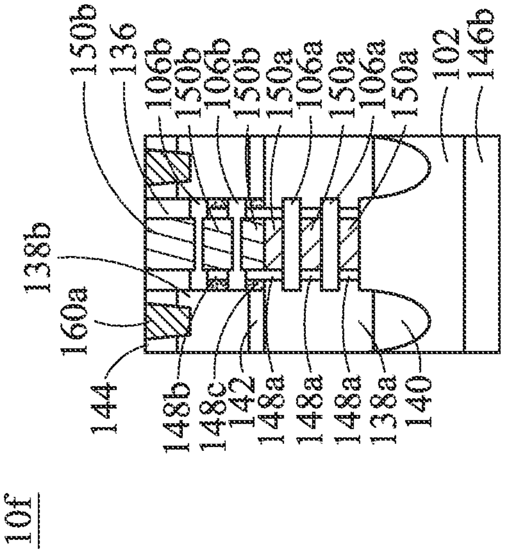

Many variations and/or modifications may be made to the embodiments of the disclosure. FIGS. 7A and 7B are cross-sectional representations of various stages of forming a semiconductor device structure **10*f*. Some processes or devices are the same as, or similar to, those described in the embodiments above, and therefore the descriptions of these processes and devices are not repeated herein. The difference from the embodiments described above is that, as shown in FIG. 7A in accordance with some embodiments, the inner spacers beside the third semiconductor material layers 104*b*** are multi-layer structures.

In some embodiments, the inner spacers **148*b* and 148*c* formed beside the second semiconductor material layers 104*b* are made of different materials. After forming the first source/drain epitaxial structure 138*a*, the second inner spacer layer 148*b* beside the third semiconductor material layer 104*b* is etched back and remained over sidewalls of the third semiconductor material layer 104*b*, and third inner spacers 148*c* are formed over sidewalls of the second inner spacers 148*b*. The third inner spacers 148*c* may be formed by conformally depositing the third inner spacer layer 148*c* in the recess and the source/drain opening, and the third inner spacer layer 148*c* not covered by the dummy gate structure 124 and the gate spacer layers 136** are removed.

The third inner spacer layer **148*c* may be made of $SiO_2$, SiN, SiCN, SiCON, SiCO, AlO, HfO, other high dielectric constant material (for example, dielectric constant greater or equal to 7) or a combination thereof. In some embodiments, the second inner spacers 148*b* and the third inner spacers 148*c* are made of different materials. With harder material such as SiN, the inner spacers 148*b* and 148*c*** may resist breakage during the following processes. With lower dielectric constant material such as SiCON, the capacitance may be reduced.

By forming the first inner spacers **148*a* and the inner spacers 148*b* and 148*c* with different widths, the device performance may be enhanced. With thicker inner spacers 148*b* and 148*c*, the capacitance may be reduced. With thinner inner spacers 148*a*, the on-current may be increased. The inner spacers 148*b* and 148*c* formed beside the second gate structure 150*b* may be a multi-layer structure. The inner spacers 148*b* and 148*c* may be made of different materials. With harder material, the inner spacers 148*b* and 148*c*** may resist breakage. With lower dielectric constant material, the capacitance may be reduced.

As described previously, the inner spacers **148*a* and 148*b* of PMOS and NMOS of CFET have different widths. With thicker inner spacers, the capacitance may be reduced. With thinner inner spacers, the on-current may be increased. In some embodiments as shown in FIG. 2, the first inner spacers 148*a* is trimmed before forming the first source/drain epitaxial structure 138*a*. In some embodiments as shown in FIG. 3, the second inner spacers 148*b* is trimmed before forming the second source/drain epitaxial structure 138*b*. In some embodiments as shown in FIG. 4, the second inner spacers 148*b* is trimmed after forming nanostructures 106*a* and 106*b* and before forming the second gate structure 150*b*. In some embodiments as shown in FIG. 5, the first semiconductor material layers 104*a* and the third semiconductor material layers 104*b* with different concentrations of Ge are with different etching rate. In some embodiments as shown in FIG. 6, the first inner spacers 148*a* and the third inner spacers 148*c* are made of different materials. In some embodiments as shown in FIG. 7**, the inner spacers are multi-layer structures.

Embodiments of a semiconductor device structure and a method for forming the same are provided. The CFET structure with different inner spacer widths may enhance device performance. Thicker inner spacers may reduce the capacitance. Thinner inner spacers may increase the on-current.

In some embodiments, a semiconductor device structure is provided. The semiconductor device structure includes first nanostructures formed over a substrate. The semiconductor device structure also includes a first gate structure wrapped around the first nanostructures. The semiconductor device structure also includes first source/drain epitaxial structures formed over opposite sides of the first nanostructures. The semiconductor device structure also includes first inner spacers formed between the first gate structure and the first source/drain epitaxial structures. The semiconductor device structure also includes second nanostructures formed over the first nanostructures. The semiconductor device structure also includes a second gate structure wrapped around the second nanostructures. The semiconductor device structure also includes second source/drain epitaxial structures formed over opposite sides of the second nanostructures. The semiconductor device structure also includes second inner spacers formed between the second gate structure and the second source/drain epitaxial structures. The first inner spacers and the second inner spacers have different widths.

In some embodiments, a method for forming a semiconductor device structure is provided. The method for forming a semiconductor device structure includes forming a dummy gate structure across the fin structure. The method for forming a semiconductor device structure also includes forming source/drain openings beside the dummy gate structure. The method for forming a semiconductor device structure also includes laterally etching the first semiconductor material layers and the third semiconductor material layers from the source/drain openings. The method for forming a semiconductor device structure also includes forming first inner spacers and second inner spacers over sidewalls of the first semiconductor material layers and the third semiconductor material layers, respectively. The method for forming a semiconductor device structure also includes growing first source/drain epitaxial structures and second source/drain epitaxial structures in the source/drain openings beside the first inner spacers and the second inner spacers, respectively. The method for forming a semiconductor device structure also includes removing the dummy gate structure, the first semiconductor material layers, and the third semiconductor material layers to form a gate opening. The method for forming a semiconductor device structure also includes forming a first gate structure and a second gate structure in the gate opening surrounding the second semiconductor material layers and the fourth semiconductor material layers, respectively. The sidewalls of the first inner spacers are misaligned with the sidewalls of the second inner spacers.

In some embodiments, a method for forming a semiconductor device structure is provided. The method for forming a semiconductor device structure includes forming a fin structure with alternating stacked channel layers and sacrificial layers over a substrate. The method for forming a semiconductor device structure also includes forming a dummy gate structure across the fin structure. The method for forming a semiconductor device structure also includes forming spacer layers over opposite sides of the dummy gate structure. The method for forming a semiconductor device structure also includes partially removing the fin structure exposed by the dummy gate structure. The method for forming a semiconductor device structure also includes recessing sidewalls of the sacrificial layers. The method for forming a semiconductor device structure also includes depositing an inner spacer layer over sidewalls of the channel layers and the sacrificial layers. The method for forming a semiconductor device structure also includes etching the inner spacer layer until the sidewalls of the channel layers are exposed so that inner spacers can be formed. The method for forming a semiconductor device structure also includes trimming the inner spacers in a first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:

first nanostructures formed over a substrate;

a first gate structure wrapped around the first nanostructures;

first source/drain epitaxial structures formed over opposite sides of the first nanostructures;

first inner spacers formed between the first gate structure and the first source/drain epitaxial structures;

second nanostructures formed over the first nanostructures;

a second gate structure wrapped around the second nanostructures;

second source/drain epitaxial structures formed over opposite sides of the second nanostructures; and second inner spacers formed between the second gate structure and the second source/drain epitaxial structures, wherein the first inner spacers and the second inner spacers have different widths, and wherein an interface is between a portion of the second inner spacers and a portion of the first source/drain epitaxial structures.

2. The semiconductor device structure as claimed in claim 1, wherein the second inner spacers cover a portion of top surfaces of the first source/drain epitaxial structures.

3. The semiconductor device structure as claimed in claim 1, wherein sidewalls of the first source/drain epitaxial structures are misaligned with sidewalls of the second source/drain epitaxial structures.

4. The semiconductor device structure as claimed in claim 1, further comprising:

spacer layers formed over the second inner spacers, wherein the spacer layers and the first inner spacers have different widths.

5. The semiconductor device structure as claimed in claim 1, wherein the first inner spacers and the second inner spacers are made of different materials.

6. The semiconductor device structure as claimed in claim 1, further comprising:

third inner spacers formed over sidewalls of the second inner spacers and between the second gate structure and the second source/drain epitaxial structures.

7. The semiconductor device structure as claimed in claim 1, wherein an end of the first nanostructures is embedded in the first source/drain epitaxial structures.

8. The semiconductor device structure as claimed in claim 1, wherein a portion of the first source/drain epitaxial structures is extended between the first nanostructures and the second inner spacers.

9. A method for forming a semiconductor device structure, comprising:

forming a fin structure on a substrate with alternately stacked first semiconductor material layers and second semiconductor material layers and alternately stacked third semiconductor material layers and fourth semiconductor material layers;

forming a dummy gate structure across the fin structure;

forming source/drain openings beside the dummy gate structure;

laterally etching the first semiconductor material layers and the third semiconductor material layers from the source/drain openings;

forming first inner spacers and second inner spacers over sidewalls of the first semiconductor material layers and the third semiconductor material layers, respectively;

growing first source/drain epitaxial structures and second source/drain epitaxial structures in the source/drain openings beside the first inner spacers and the second inner spacers, respectively;

removing the dummy gate structure, the first semiconductor material layers, and the third semiconductor material layers to form a gate opening; and forming a first gate structure and a second gate structure in the gate opening surrounding the second semiconductor material layers and the fourth semiconductor material layers, respectively, wherein sidewalls of the first inner spacers are misaligned with sidewalls of the second inner spacers, wherein an etching rate of the first semiconductor material layers is different from an etching rate of the third semiconductor material layers when laterally etching the first semiconductor material layers and the third semiconductor material layers from the source/drain openings.

10. The method for forming the semiconductor device structure as claimed in claim 9, wherein the first semiconductor material layers and the third semiconductor material layers comprise SiGe, and a concentration of Ge in the first semiconductor material layers is different from a concentration of Ge in the third semiconductor material layers.

11. The method for forming the semiconductor device structure as claimed in claim 9, further comprising:

forming a dielectric structure between the first source/drain epitaxial structures and the substrate.

12. A method for forming a semiconductor device structure, comprising:

forming a fin structure with alternating stacked channel layers and sacrificial layers over a substrate;

forming a dummy gate structure across the fin structure;

forming spacer layers over opposite sides of the dummy gate structure;

partially removing the fin structure exposed by the dummy gate structure;

recessing sidewalls of the sacrificial layers;

depositing an inner spacer layer over sidewalls of the channel layers and the sacrificial layers;

etching the inner spacer layer until the sidewalls of the channel layers are exposed so that inner spacers are formed;

forming dummy structures beside lower portions of the channel layers;

forming a cover layer over the dummy structures;

etching the cover layer;

removing the dummy structures; and trimming the inner spacers in a first region.

13. The method for forming the semiconductor device structure as claimed in claim 12, wherein a portion of top surfaces and bottom surfaces of the channel layers are exposed after trimming the inner spacers in the first region.

14. The method for forming the semiconductor device structure as claimed in claim 12, wherein trimming the inner spacers in the first region comprises partially etching the inner spacers in the first region, while the inner spacers in a second region remain.

15. The method for forming the semiconductor device structure as claimed in claim 12, further comprising:

removing the sacrificial layers to form a gate opening;

forming a first gate structure in the gate opening; and etching back the first gate structure before trimming the inner spacers in the first region.

16. The method for forming the semiconductor device structure as claimed in claim 15, further comprising:

forming a second gate structure over the first gate structure in the gate opening, wherein the second gate structure is wider than the first gate structure.

17. The method for forming the semiconductor device structure as claimed in claim 16, wherein the second gate structure covers a portion of the inner spacers in the first region.

18. The method for forming the semiconductor device structure as claimed in claim 12, wherein the cover layer remains after trimming the inner spacers in the first region.

19. The method for forming the semiconductor device structure as claimed in claim 12, further comprising:

forming a first source/drain epitaxial structures beside the channel layers in the first region, wherein the first source/drain epitaxial structures wrapped around end portions of the channel layers in the first region.

20. The method for forming the semiconductor device structure as claimed in claim 19, before forming the first source/drain epitaxial structures, further comprising:

forming a second source/drain epitaxial structures beside the channel layers in a second region;

forming an isolation layer on the second source/drain epitaxial structures; and forming the first source/drain epitaxial structures, wherein a top surface of the isolation layer is substantially aligned with a topmost surface of the inner spacers in the second region.

* * * * *